United States Patent
Sako et al.

(10) Patent No.: US 8,358,545 B2
(45) Date of Patent: Jan. 22, 2013

(54) SEMICONDUCTOR MEMORY

(75) Inventors: Mario Sako, Yokohama (JP); Yoshihiko Kamata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/235,416

(22) Filed: Sep. 18, 2011

(65) Prior Publication Data

US 2012/0113724 A1    May 10, 2012

(30) Foreign Application Priority Data

Nov. 4, 2010    (JP) .................................. 2010-247702

(51) Int. Cl.
  *G11C 7/10*    (2006.01)
  *G11C 11/34*    (2006.01)
  *G11C 16/06*    (2006.01)
  *G11C 5/06*    (2006.01)

(52) U.S. Cl. ......... 365/189.05; 365/185.09; 365/185.21; 365/185.22; 365/63; 365/200

(58) Field of Classification Search ............. 365/185.09, 365/185.21, 185.22, 63, 189.05, 200
See application file for complete search history.

(56) References Cited

U.S. PATENT DOCUMENTS

| 2010/0008157 A1* | 1/2010 | Honma | ..................... 365/189.05 |
| 2011/0141817 A1* | 6/2011 | Takagiwa | ................. 365/185.22 |

FOREIGN PATENT DOCUMENTS

| JP | 5-95257 | 4/1993 |
| JP | 2006-79695 A | 3/2006 |
| JP | 2006-331611 A | 12/2006 |
| JP | 2010-247702 | 11/2010 |

OTHER PUBLICATIONS

Japanese Office Action issued Apr. 3, 2012 in patent application No. 2010-247702 with English translation.

* cited by examiner

*Primary Examiner* — Ly D Pham
(74) *Attorney, Agent, or Firm* — Oblon, Spivak, McClelland, Maier & Neustadt, L.L.P.

(57) ABSTRACT

According to one embodiment, a semiconductor memory includes a memory cell array including a plurality of memory cells, a sense amplifier circuit holding a verification result for the memory cells and including sense units, the sense units of each column block being connected in common to a first signal line, and a detecting circuit including a detecting unit. The detecting unit includes a first latch circuit which holds failure information in the memory cell arrays, and a second latch circuit which includes a first input terminal connected to the first signal line, a second input terminal connected to the first latch circuit, and a first output terminal connected to a second signal line.

20 Claims, 23 Drawing Sheets

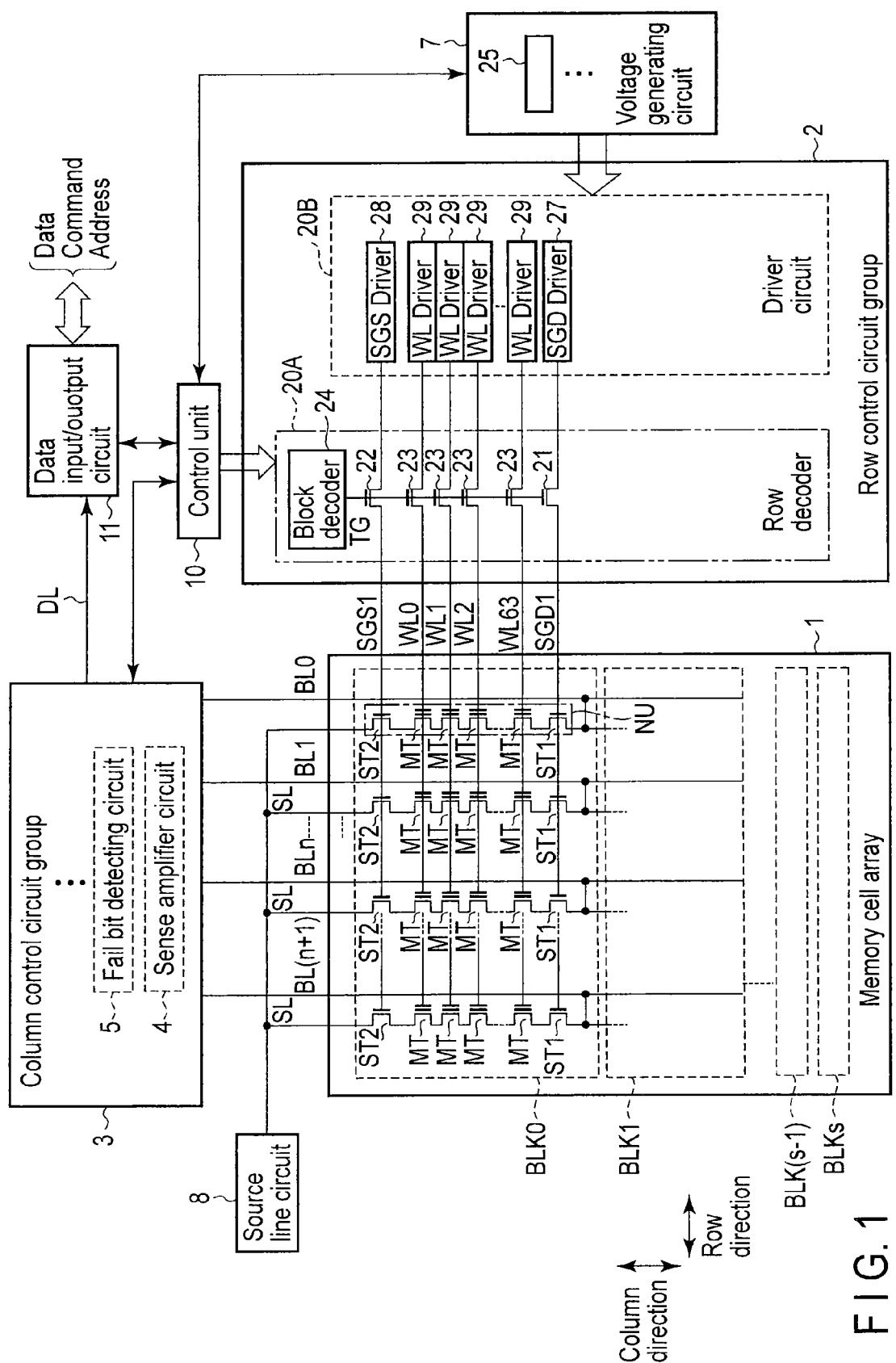
F I G. 1

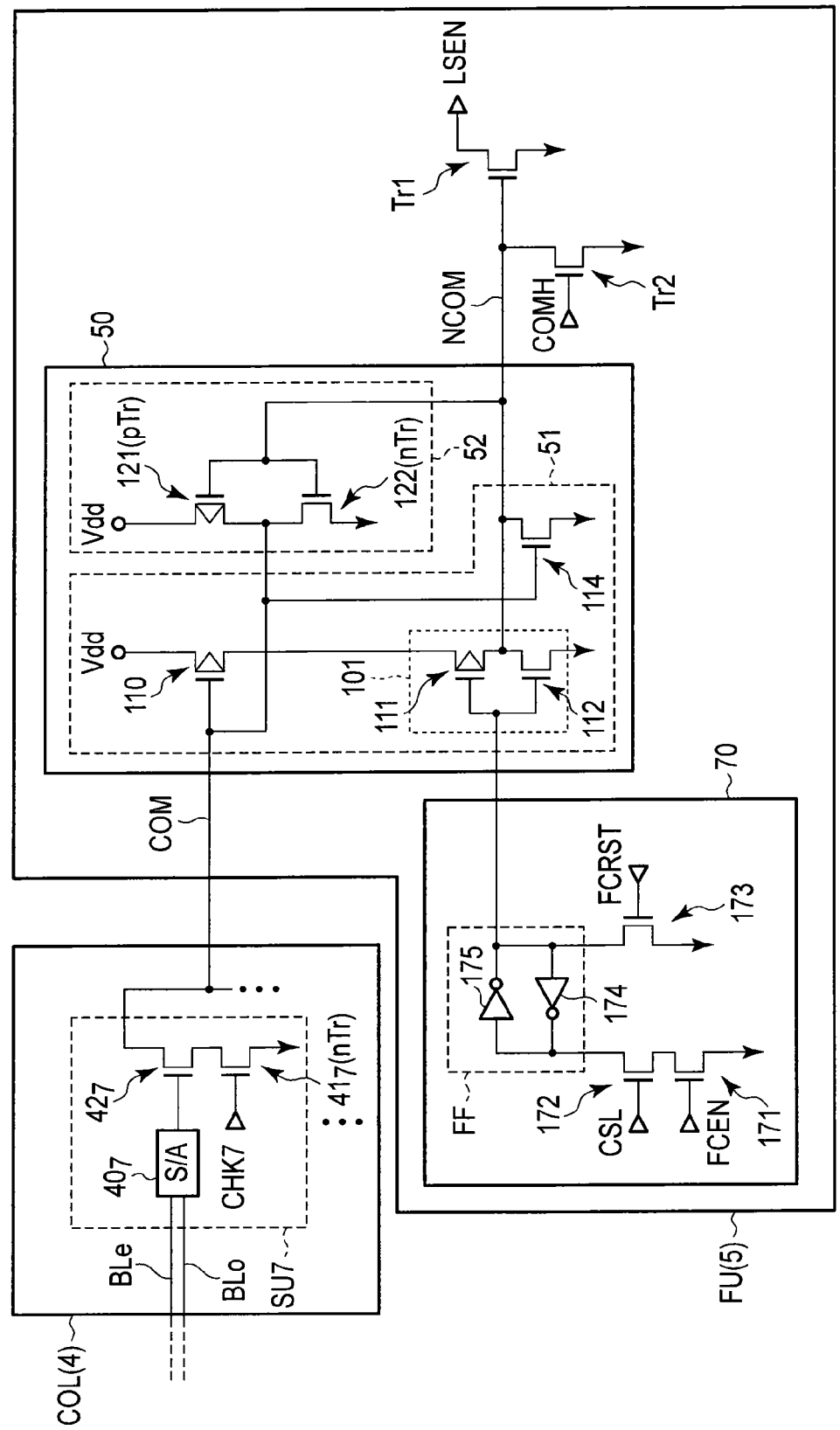
F I G. 4

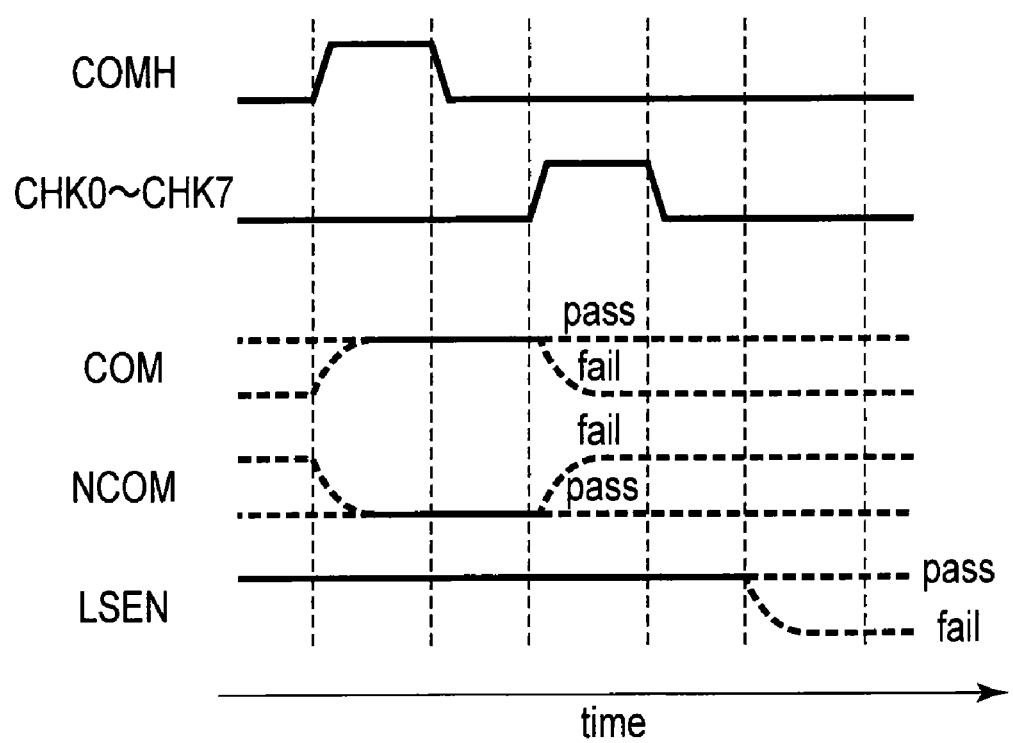
F I G. 5

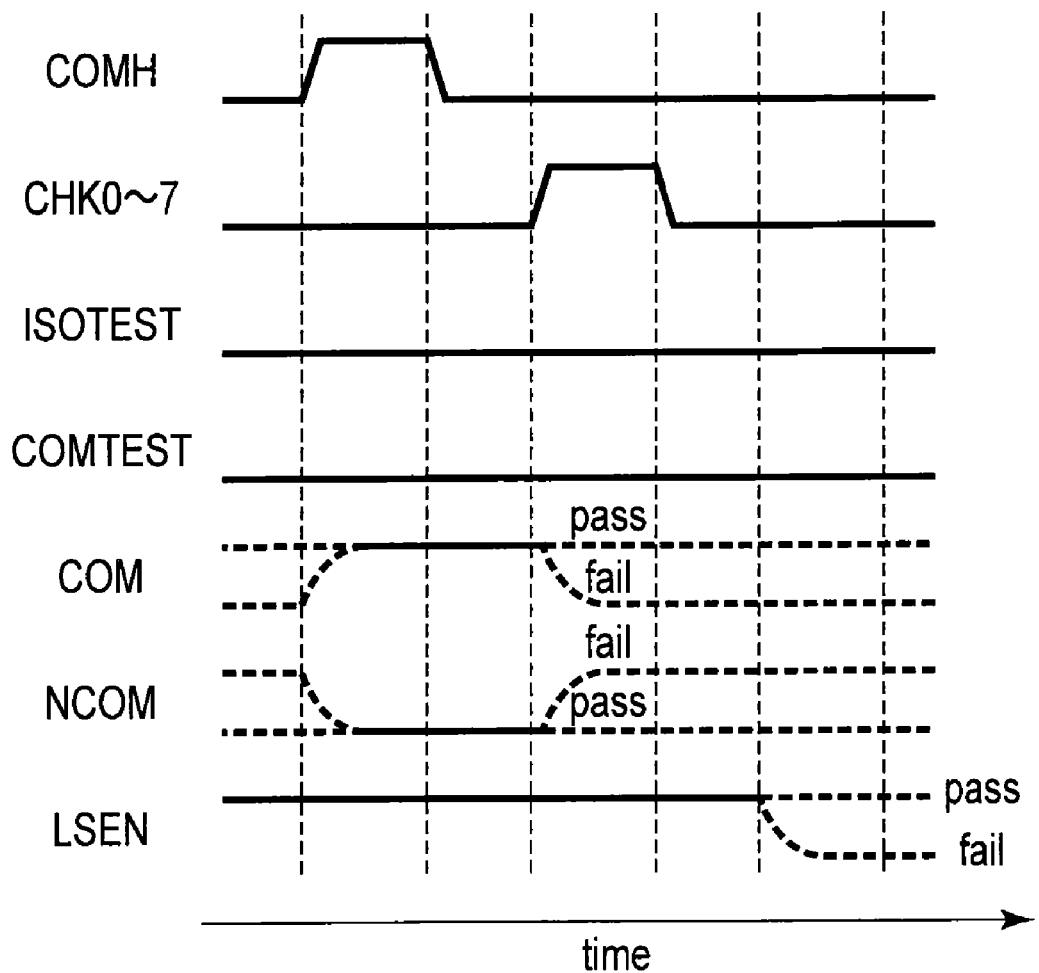
F I G. 8

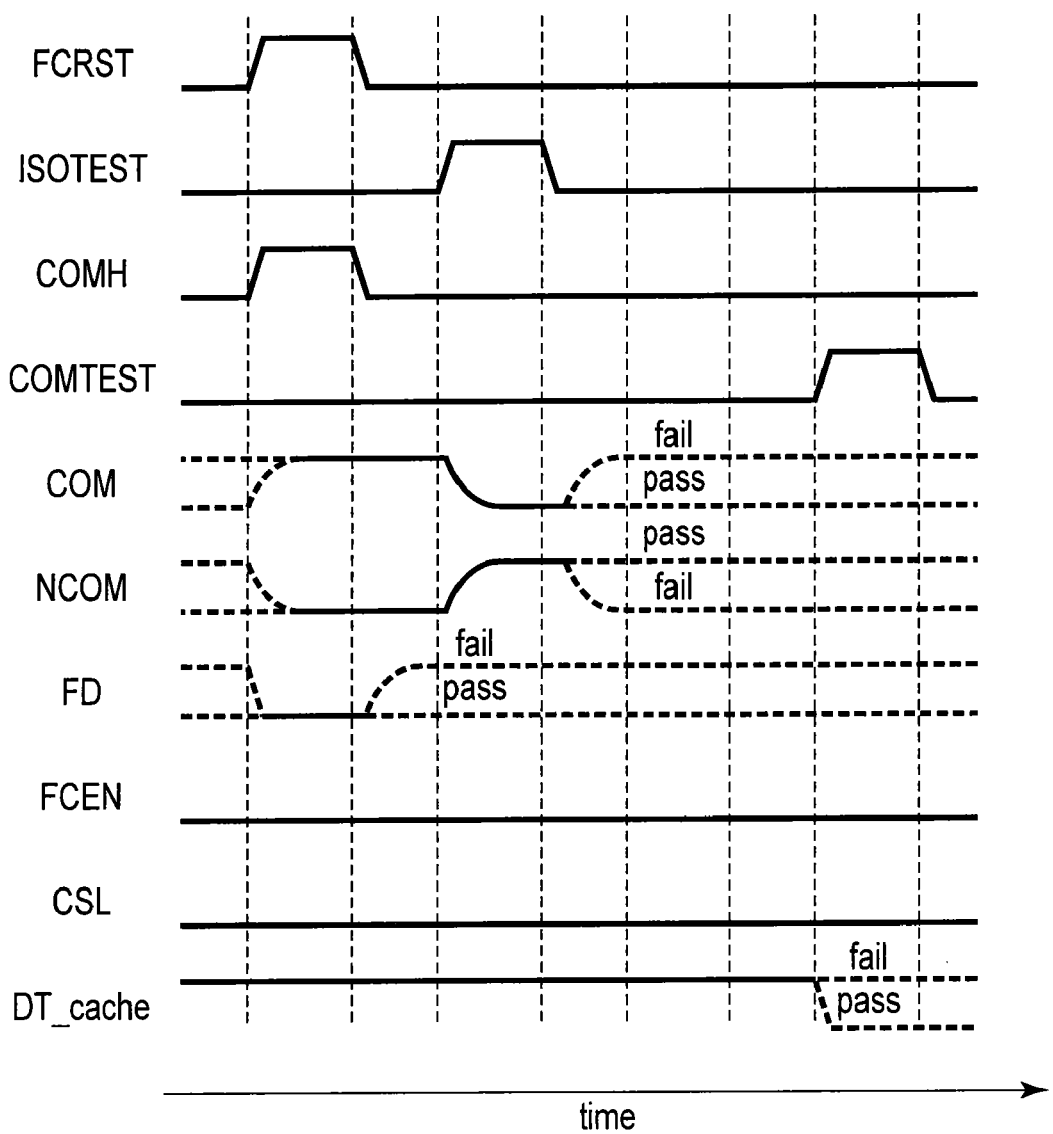
F I G. 12

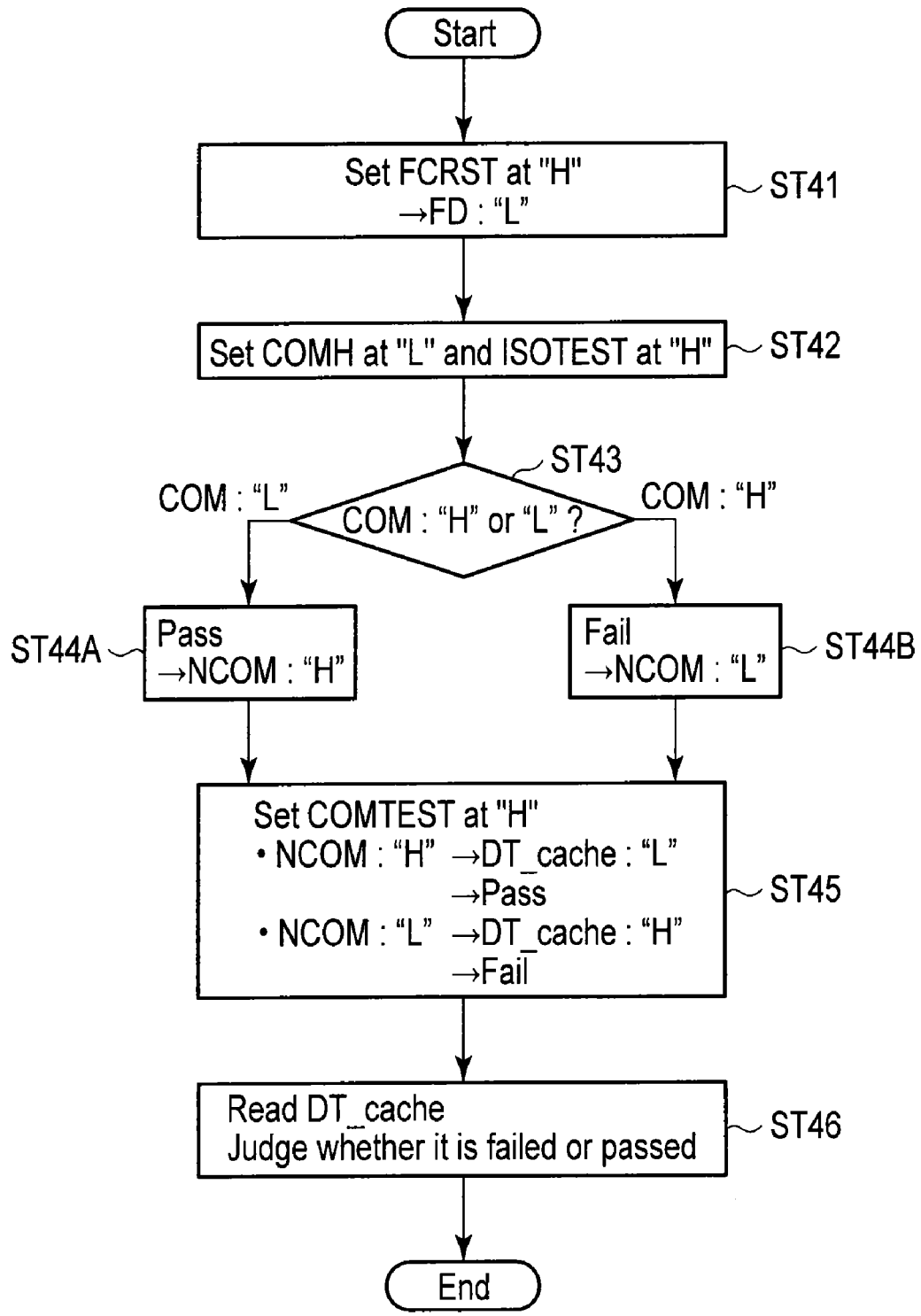
F I G. 15

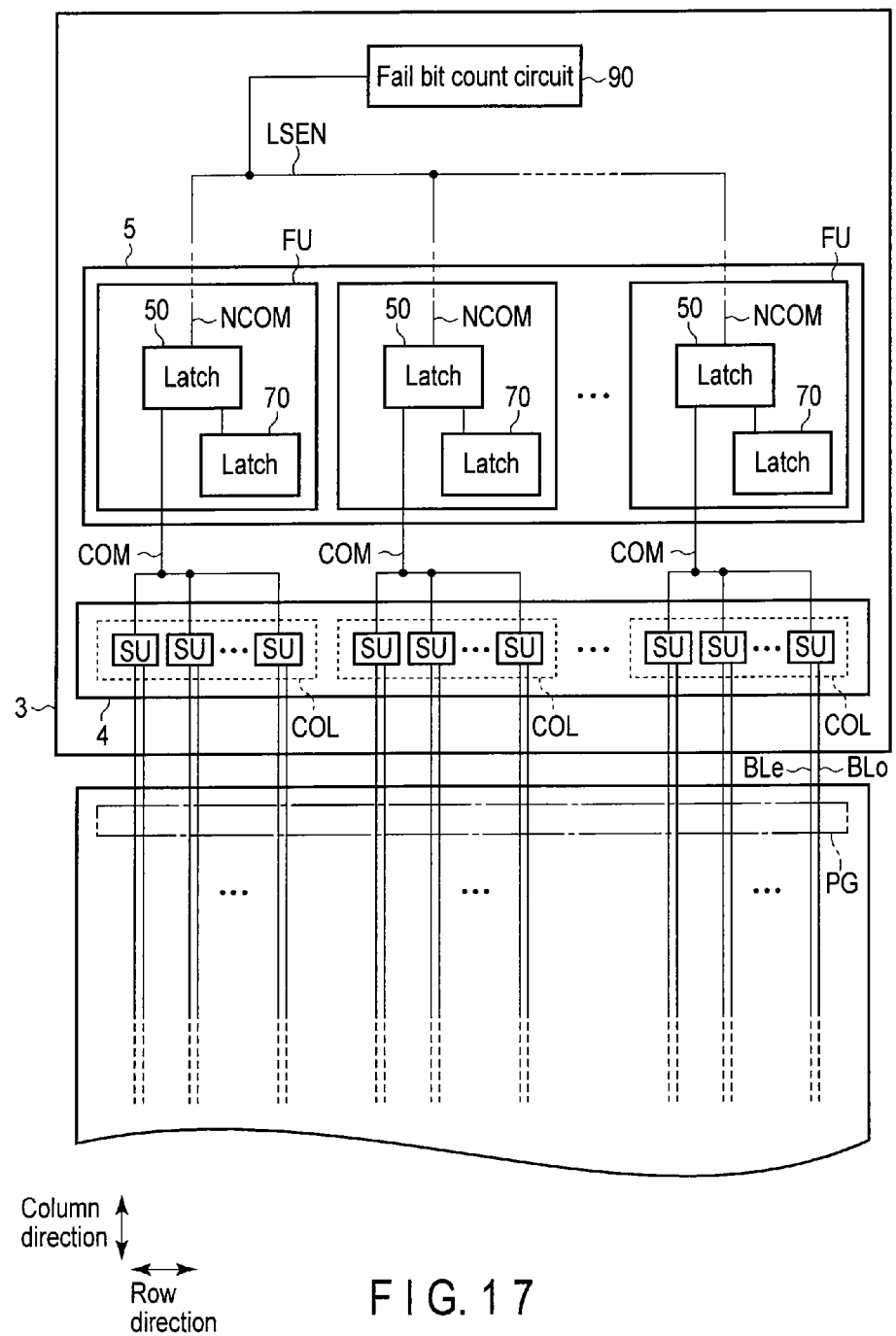
F I G. 17

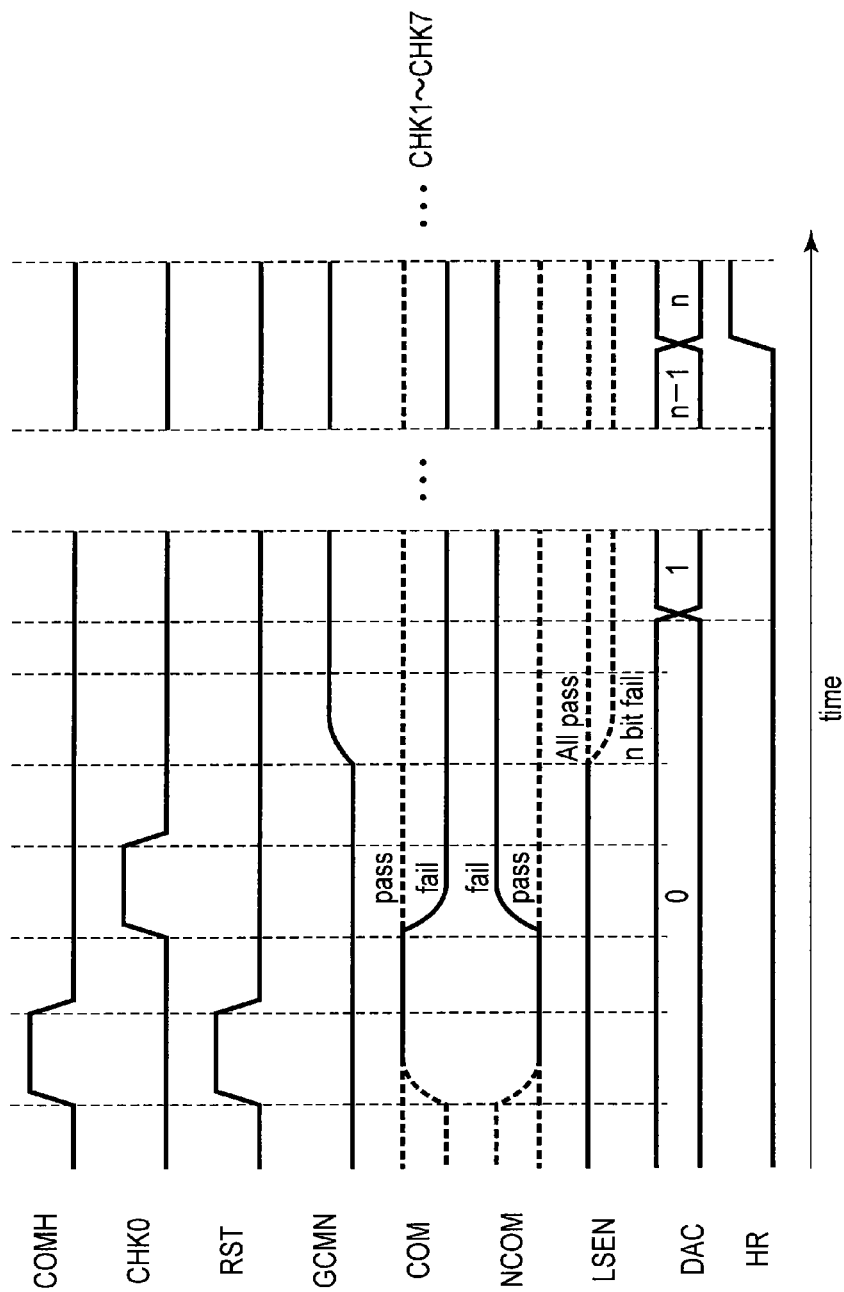
F I G. 20

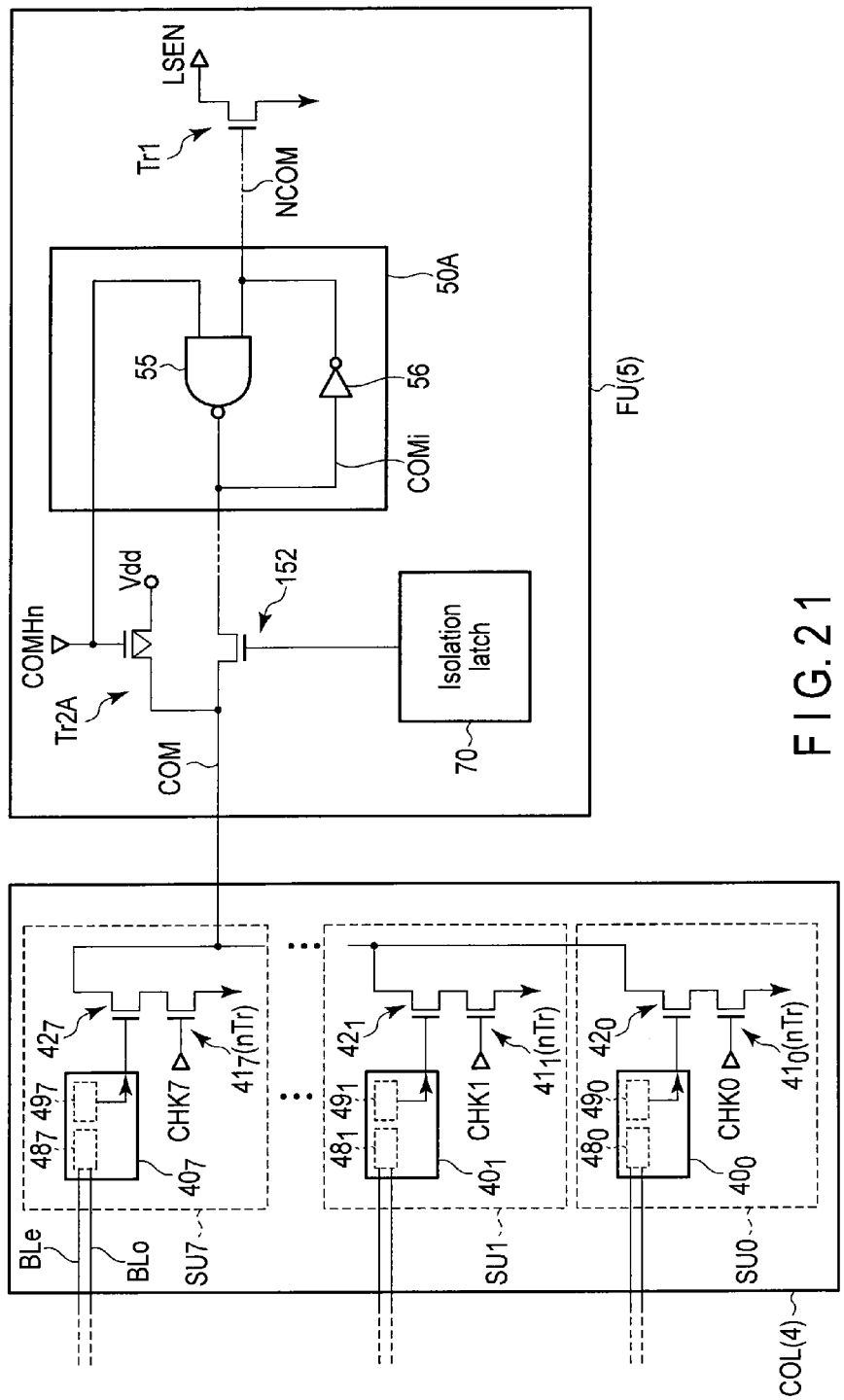
F I G. 21

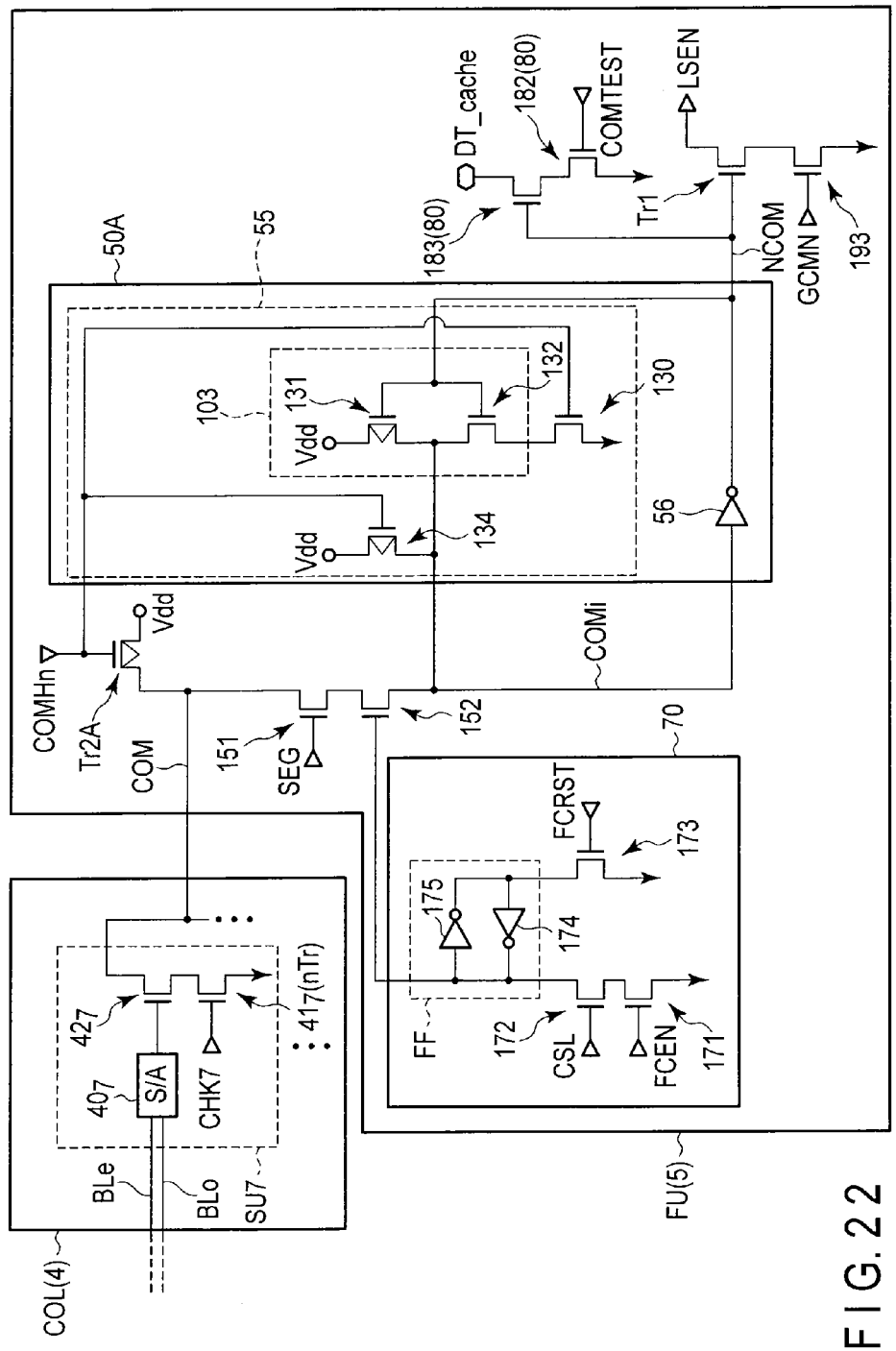
F I G. 22

SEMICONDUCTOR MEMORY

CROSS-REFERENCE TO RELATED APPLICATIONS

This application is based upon and claims the benefit of priority from prior Japanese Patent Application No. 2010-247702, filed Nov. 4, 2010, the entire contents of which are incorporated herein by reference.

FIELD

Embodiments described herein relate generally to a semiconductor memory.

BACKGROUND

In a semiconductor memory, for example, a flash memory, miniaturization of a device is advanced for reducing a manufacturing cost, and the number of devices for one chip is increasing.

In association with the miniaturization of the device, a failure, which has not been problematic so far, might be exposed. For example, considering a leak current of a field effect transistor resulting from the miniaturization, although the leak current of one device is minute, the leak current of an entire chip is large. Such leak current might cause an increase in power consumption of the memory and deterioration in reliability of memory operation.

Further, the failure of one device in a certain circuit might lead to the failure of an entire circuit.

BRIEF DESCRIPTION OF THE DRAWINGS

FIG. 1 is a view illustrating an entire configuration of a semiconductor memory;

FIG. 4 is an equivalent circuit diagram of the circuit configuration example of the semiconductor memory of the first embodiment;

FIG. 5 is a timing chart of an operation example of the semiconductor memory of the first embodiment;

FIG. 8 is a timing chart of an operation example of the semiconductor memory of the second embodiment;

FIG. 12 is a timing chart of the operation example of the semiconductor memory of the second embodiment;

FIG. 15 is a flow chart of the operation example of the semiconductor memory of the second embodiment;

FIG. 17 is a block diagram of an internal configuration example of a semiconductor memory of a third embodiment;

FIG. 20 is a timing chart of an operation example of the semiconductor memory of the third embodiment;

FIG. 21 is a block diagram of an internal configuration example of a semiconductor memory of a fourth embodiment;

FIG. 22 is an equivalent circuit diagram of a circuit configuration example of the semiconductor memory of the fourth embodiment.

DETAILED DESCRIPTION

Figure 2:
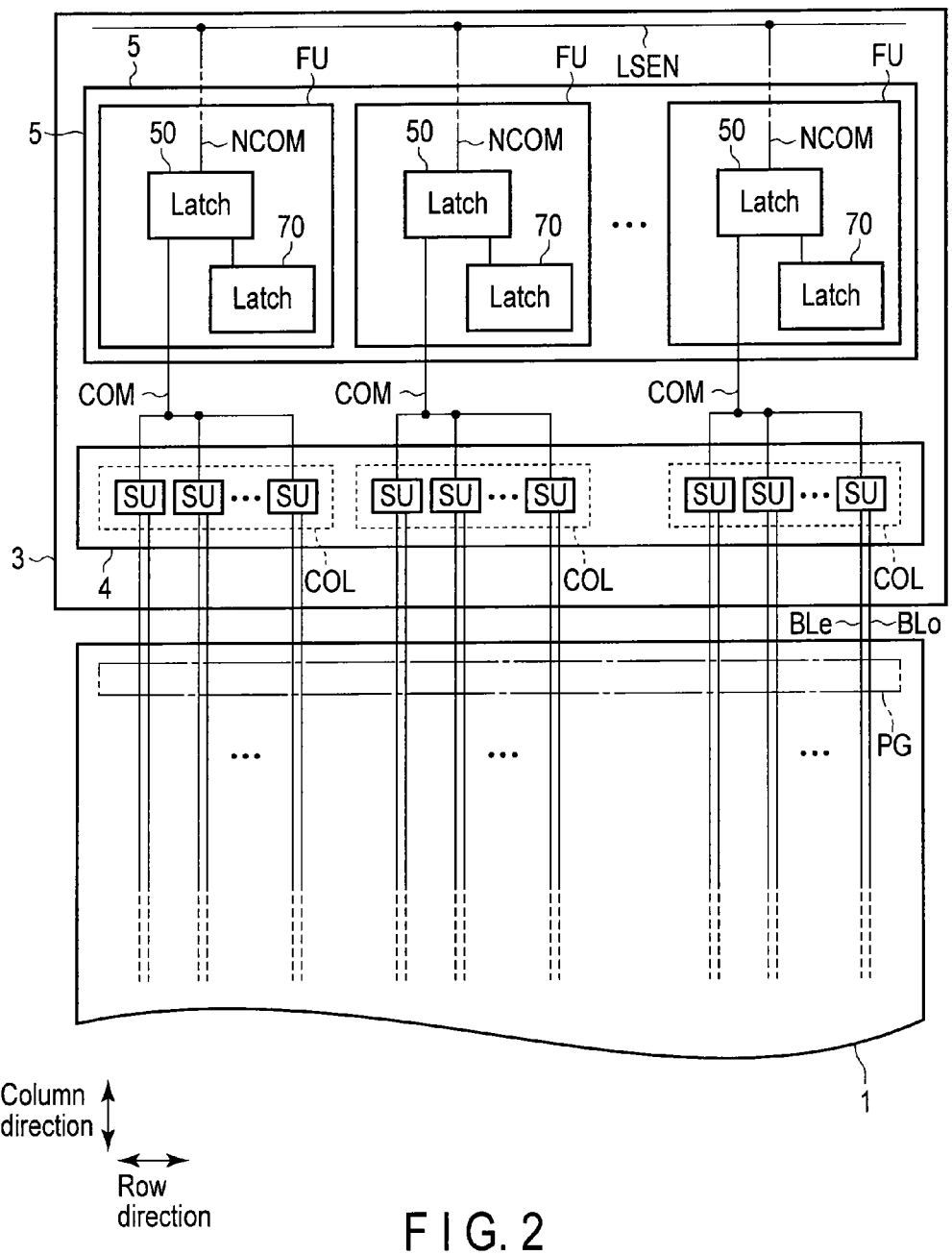
FIG. 2 is a block diagram of an internal configuration example of the semiconductor memory of a first embodiment.

This embodiment is hereinafter described in detail with reference to the drawings. In a following description, the same reference numeral is assigned to components having the same function and configuration and the description is repeated as needed.

In general, according to one embodiment, a semiconductor memory includes a memory cell array including a plurality of memory cells arranged along a row and a column; a sense amplifier circuit holding a verification result for each of the memory cells and including a plurality of sense units, the sense units of each column block being connected in common to a first signal line; and a detecting circuit including a detecting unit, the detecting unit including a first latch circuit which holds failure information in the memory cell arrays, and a second latch circuit which includes a first input terminal connected to the first signal line, a second input terminal connected to the first latch circuit, and a first output terminal connected to a second signal line.

(1) First Embodiment

A semiconductor memory of a first embodiment is described with reference to FIGS. 1 to 5.

(a) Entire Configuration Example

An entire configuration example of the semiconductor memory according this embodiment is described with reference to FIG. 1.

As illustrated in FIG. 1, the semiconductor memory according to this embodiment includes a memory cell array 1, a row control circuit group 2, a column control circuit group 3, a voltage generating circuit 7, a source line driver 8, a data input/output circuit 11, and a control unit 10.

The row control circuit group 2 includes a plurality of circuits used to control rows of the memory cell array 1, and has a row decoder 20A and a driver circuit 20B, for example. The column control circuit group 3 includes a plurality of circuits used to control columns of the memory cell array 1, and has a sense amplifier circuit 4 and a fail bit detecting circuit 5, for example.

The semiconductor memory of this embodiment is a NAND flash memory, for example.

The memory cell array 1 is provided with a plurality of blocks BLK0 to BLKs (s is a natural number). Each of the blocks BLK0 to BLKs is provided with a plurality of NAND cell units NU. Each of the NAND cell units NU includes 64 memory cell transistors MT and select transistors ST1 and ST2, for example. Meanwhile, the number of memory cell transistors MT in the NAND cell unit NU is not limited to 64, and may be 128, 256, 512 and the like, and the number of memory cell transistors is not limited.

A plurality of memory cell transistors MT are arranged in a row direction and in a column direction in the memory cell array 1.

The memory cell transistor MT is a nonvolatile memory device, which holds data in a nonvolatile manner. The memory cell transistor MT is capable of holding 2-or-higher-level data.

For example, the memory cell transistor MT is an n-channel MOS transistor having a charge storage layer.

The memory cell transistor MT has a structure including a gate insulating film provided on a channel region between a source region and a drain region in a semiconductor substrate, the charge storage layer formed on the channel region with the gate insulating film interposed therebetween, an intergate insulating film provided on the charge storage layer, and a control gate provided on the intergate insulating film.

For example, when the charge storage layer is a floating gate in which a conductive layer (for example, silicon layer) is used, the memory cell transistor MT becomes a floating gate type field effect transistor. When the charge storage layer is an insulating layer (for example, silicon nitride layer) including a trap level, the memory cell transistor MT becomes a MONOS field effect transistor. In a MONOS memory cell transistor MT, the insulating film which has a higher dielectric constant than that of the charge storage layer is used as the intergate insulating film. The intergate insulating film of the MONOS memory cell transistor MT is also referred to as a block insulating film. A gate length (channel length or node length) of the memory cell transistor MT is set to be 40 nm or shorter, for example, and more preferably 32 nm or shorter in order to improve the storage density of a chip.

The control gate of the memory cell transistor MT is electrically connected to a word line, a drain thereof is electrically connected to a bit line, and a source thereof is electrically connected to a source line.

The adjacent memory cell transistors MT in the NAND cell unit NU share the source and the drain and current paths of a plurality of memory cell transistors MT are connected in series. In the NAND cell unit NU, an assemblage of a plurality of memory cell transistors MT of which current paths are connected in series is also referred to as a NAND string.

The NAND string is arranged between two select transistors ST1 and ST2. According to this, the NAND cell unit NU is formed.

One end (drain side) of the memory cell transistors MT connected in series is connected to a source of the select transistor ST1, and the other end (source side) is connected to a drain of the select transistor ST2. In the NAND cell unit, the drain of the memory cell transistors connected in series (NAND string) is connected to a bit line BL through the select transistor ST1 and the source of the memory cell transistors connected in series is connected to a source line SL through the select transistor ST2.

In the memory cell array 1, the control gates of the memory cell transistors MT arranged in the same row are connected in common to any one of word lines WL0 to WL63. Gate electrodes of the select transistors ST1 arranged in the same row and those of the select transistors ST2 arranged in the same row are connected in common to select gate lines SGD1 and SGS1, respectively. Meanwhile, in order to simplify the description, when the word lines WL0 to WL63 are not distinguished from one another, they are hereinafter sometimes simply referred to as the word lines WL.

In the memory cell array 1, drains of the select transistors ST1 arranged in the same column are connected in common to any one of bit lines BL0 to BLn. Hereinafter, when the bit lines BL0 to BLn (n: natural number) are not distinguished from one another, they are also referred to as the bit lines BL. Sources of the select transistors ST2 are connected in common to the source line SL.

The data are collectively erased from a plurality of memory cell transistors MT in units of blocks BLK. The data are collectively written to a plurality of memory cell transistors MT in units of pages PG.

For example, each memory cell transistor MT is capable of holding 2-level data (1-bit data). That is to say, a plurality of threshold voltages are allocated to the memory cell transistor MT, and this is capable of holding two types of data; "1" and "0", according to a threshold Vth. A judgment voltage V01 for judging a magnitude of the threshold voltage is set between the threshold voltages corresponding to the data.

In the memory cell transistor MT, a threshold voltage Vth0 corresponding to the data "1" satisfies Vth0<V01 and a threshold voltage Vth1 corresponding to the data "0" satisfies V01<Vth1. In this manner, the memory cell transistor MT is capable of holding the 1-bit data of the data "0" and the data "1" according to the threshold voltage. In the memory cell transistor MT, it is set to the data "1" (for example, negative voltage) in an erased state and it is set to a positive threshold voltage by injection of charge into the charge storage layer at the time of data writing.

Each memory cell transistor MT is also capable of holding the data larger than the 2-level data. For example, the memory cell transistor MT is also capable of holding 4-level data (2-bit data) "11", "10", "01", and "00". In this case, four threshold voltages are allocated to the memory cell transistor MT. The judgment voltage is set between each two threshold voltages.

In the row control circuit group 2, the row decoder 20A has a block decoder 24 and field effect transistors 21 to 23.

The field effect transistors 21 to 23 in the row decoder 2 are the n-channel MOS transistors, for example. A control line TG extending from the block decoder 24 is connected to gates of the field effect transistors 21 to 23.

At the time of data write operation, data read operation, and data erasing, the block decoder 24 decodes a block address supplied from the control unit 10 and selects the block BLK based on a result. That is to say, the block decoder 24 selects the control line TG to which the transistors 21 to 23 corresponding to the block BLK including a selected memory cell transistor MT are connected and turns on the transistors 21 to 23. At that time, the block decoder 24 outputs a block selection signal. The block selection signal is the signal with which the row decoder 20A selects any one of a plurality of memory blocks BLK0 to BLKs at the time of data reading, data writing, the data erasing and the like.

According to this, the row decoder 20A selects the row of the memory cell array 1 corresponding to the selected block BLK. The row decoder 20A applies a voltage supplied from the driver circuit 20B to the select gate lines SGD1 and SGS1 and the word lines WL0 to WL63 based on the block selection signal.

In the row control circuit group 2, the driver circuit 20B has select gate line drivers 27 and 28 provided for the select gate lines SGD1 and SGS1, respectively, and a word line driver 29 provided for each word line WL. In this embodiment, only the word line drivers 29 and the select gate line drivers 27 and 28 corresponding to one block BLK0 are illustrated. However, the word line drivers 29 and the select gate line drivers 27 and 28 are connected in common to the 64 word lines WL and the select gate lines SGD1 and SGS1, for example, provided in each of the blocks BLK0 to BLKs.

The block BLK is selected according to a decode result of a page address supplied from the control unit 10.

The word line driver 29 transfers the voltage used in each operation to the control gate of the memory cell transistor MT provided in the selected block BLK through a selected word line WL.

The select gate line driver 27 transfers the voltage used in each operation to the gate of the select transistor ST1 through the select gate line SGD1 corresponding to the selected block BLK. At that time, the select gate line driver 27 transfers a signal sgd to the gate of the select transistor ST1. Specifically, at the time of the data writing, the data reading, the data erasing, and further at the time of data verification, the select gate line driver 27 transfers the signal sgd to the gate of the select transistor ST1, for example, through the select gate line SGD1. For example, as the signal sgd, the voltage of approximately 0V to 4V is used according to the operation of the select transistor ST1.

Further, as with the select gate line driver 27, at the time of the data writing, the data reading, or the data verification, the select gate line driver 28 transfers the voltage used in each operation to the gate of the select transistor ST2 through the select gate line SGS1 corresponding to the selected block BLK. At that time, the select gate line driver 28 transfers a signal sgs to the gate of the select transistor ST2. For example, as the signal sgs, the voltage of approximately 0V to 4V is used according to the operation of the select transistor ST2.

The voltage generating circuit 7 has a plurality of voltage generating units 25, which generates voltages of different magnitudes.

Each of the voltage generating units 25 generates a voltage VPGM and a voltage VPASS at the time of the data writing, a voltage VERA at the time of the data erase operation, and a voltage VCGR and a voltage VREAD at the time of the data reading, respectively, for example. The voltage generating unit 25 generates the voltage other than the voltages VPGM, VPASS, VERA, VCGR, and VREAD according to the operation of the flash memory.

At the time of the data writing, a predetermined voltage generating unit 25 generates the voltage VPGM and transfers the voltage VPGM to the selected word line WL to which the memory cell transistor MT, which is an operation target, is connected. The voltage VPGM has the magnitude such that the charge of the channel formed below the gate of the memory cell transistor MT is injected into the charge storage layer and the threshold voltage of the memory cell transistor MT transitions to another level. The voltage VPGM is hereinafter referred to as a writing voltage VPGM. At the time of the data writing, another voltage generating unit 25 generates the voltage VPASS and transfers a predetermined voltage, for example, the voltage VPASS to a non-selected word line WL other than the selected word line. The voltage VPASS is the voltage at which the memory cell transistor MT is turned on. The voltage VPASS is set to be smaller than the writing voltage VPGM such that the threshold voltage does not transition to another level. Hereinafter, the voltage VPASS is referred to as a non-selected voltage VPASS. Meanwhile, according to whether the memory is a 2-level memory or a multilevel memory, or according to a writing system used in the flash memory, the voltage other than the voltage VPASS may be transferred to a predetermined non-selected word line.

At the time of the data erasing, a predetermined voltage generating unit 25 generates the voltage VERA and transfers the same to a well. The voltage VERA is 20 [V], for example. At the time of the data erasing, the voltage VERA generated by the voltage generating unit 25 is applied to a well region in which the memory cell transistor MT is formed.

At the time of the data reading, a predetermined voltage generating unit 25 generates the voltage VCGR and transfers the voltage VCGR to the selected word line WL. The voltage VCGR is the voltage corresponding to the data to be read from the memory cell transistor MT. Hereinafter, the voltage VCGR is referred to as a reading voltage VCGR. Further, another voltage generating unit 25 generates the voltage VREAD and transfers the voltage VREAD to the non-selected word line WL at the time of the data reading. The voltage VREAD is the voltage to turn on the memory cell transistor MT regardless of the data held by the memory cell transistor MT.

The data input/output circuit 11 transfers an address and a command supplied from a host through an I/O terminal (not illustrated) to the control unit 10. The data input/output circuit 11 transfers written data from outside to the column control circuit group 3 and the sense amplifier circuit 4 through a data line DL. When outputting the data held by the memory cell transistor MT to the host, based on control of the control unit 10, the data input/output circuit 11 receives the data amplified by the sense amplifier circuit 4 through the data line DL and thereafter outputs the same to the host through the I/O terminal.

The control unit 10 controls the operation of an entire flash memory. The control unit 10 executes an operation sequence in the data write operation, the data read operation, and the data erase operation based on the address and the command supplied from the host through the data input/output circuit 11. The control unit 10 generates the block selection signal/column selection signal based on the address and the operation sequence.

The control unit 10 outputs the block selection signal to the row control circuit group 2 and the row decoder 20A. Further, the control unit 10 outputs the column selection signal to the column control circuit group 3 and the sense amplifier circuit 4. The column selection signal is the signal to select the column direction of the sense amplifier circuit 4 and the memory cell array 1.

Further, a control signal supplied from a memory controller (not illustrated) is supplied to the control unit 10. The control unit 10 distinguishes whether the signal supplied from the host to the data input/output circuit 11 is the address or the data by the supplied control signal.

The source line driver 8 applies 0 [V] or a power-supply voltage Vdd [V] to the source line SL according to the operation of the memory cell array. The voltage Vdd is applied to the source line SL when erase verification is executed. That is to say, at the time of the erase verification, the voltage Vdd is transferred from a side of the source line SL to the bit line BL. Meanwhile, the voltage other than 0 [V] and the power-supply voltage Vdd may be applied to the source line SL according to a circuit configuration and the operation.

An internal configuration of the column control circuit group 3 is described with reference to FIG. 2.

The sense amplifier circuit 4 holds the data of one page, for example. The sense amplifier circuit 4 inputs/outputs the data of 2 kbyte per page to/from the memory cell array 1 through a plurality of bit lines BL.

The sense amplifier circuit 4 is provided with a plurality of sense units SU. Each of the sense units SU holds the data of the corresponding memory cell transistor MT.

The sense unit SU has a configuration capable of holding the 1-bit data. For example, as illustrated in FIG. 2, two bit lines BLe and BLo are connected to one sense unit SU. In this case, the data reading and the data writing are performed for one of the adjacent two bit lines BLe and BLo, that is to say, an even-numbered bit line BLe and an odd-numbered bit line BLo. Then, the reading and the writing are collectively performed for n/2 bit lines BL out of n bit lines BL of one block BLK. Hereinafter, out of one group of the bit lines BL, the bit line BL, which is a reading target or a writing target, is referred to as a selected bit line BL and the bit line BL other than the selected bit line is referred to as a non-selected bit line BL.

Meanwhile, a connection relationship between the sense unit SU and the bit line may be a configuration in which one bit line is connected to one sense unit.

In a case of the configuration in which the even-numbered/odd-numbered bit lines are connected to one sense unit SU, an assemblage of the memory cell transistors MT connected to one word line WL forms two pages. In a case of the configuration in which the bit line is connected to one sense unit SU, the assemblage of the memory cell transistors MT connected to one word line WL forms one page.

At the time of the data reading, the sense unit SU senses and amplifies the data read from the memory cell transistor MT to the bit line BL. More specifically, the sense unit SU precharges the bit line BL with the voltage Vdd and senses variation of the voltage (or current) of the bit line BL.

The sense unit SU temporarily holds the written data from outside at the time of the data writing.

Further, each sense unit SU holds a verification result of each bit line in the verification at the time of the data writing or the data erasing, for example. The verification result is indicated as an "L" level when the writing or the erasing is completed (referred to as verification pass) and is indicated as an "H" level when the writing or the erasing is not completed (referred to as verification fail).

In the sense amplifier circuit 4, a predetermined control unit COL for the column of the memory cell array 1 is set, for example. In this embodiment, this control unit is referred to as a column block COL.

For example, $2 \times 2^{10}$ column blocks COL are set when the data capacity of one page is 2 KB (2 KB/page), and $4 \times 2^{10}$ column blocks COL are set when the data capacity of one page is 4 KB (4 KB/page). Meanwhile, the data capacity of one page may also be 512 KB.

For example, one column block COL includes eight sense units SU. When one even-numbered bit line BLe and one odd-numbered bit line BLo are connected to one sense unit SU, one column block COL becomes the control unit for 16 bit lines BL. However, when the even-numbered bit lines BLe and the odd-numbered bit lines BLo are separately driven as described above, the number of bit lines BL simultaneously controlled by the column block COL is eight. Meanwhile, the number of sense units in the column block COL is not limited to eight.

A plurality of sense units SU in one column block COL are connected to a common signal line (first signal line) COM. One signal line COM is provided so as to correspond to the column block COL and the number of signal lines COM is the same as the number of set column blocks COL. Hereinafter, the signal line COM shared by a plurality of sense units SU is also referred to as a common line COM.

The fail bit detecting circuit (detecting circuit) 5 detects the data of the verification result (verification pass/verification fail) held by the sense unit SU. The fail bit detecting circuit 5 transfers a detection result to the control unit 10, for example.

The fail bit detecting circuit 5 includes a plurality of detecting units FU. One detecting unit FU corresponds to one column block COL. One detecting unit FU is connected in common to a plurality of sense units SU in the sense amplifier circuit 4 by the signal line (common line) COM. Further, the detecting unit FU is connected to a signal line LSEN through a component connected to a signal line NCOM on an output side.

The detecting unit FU performs operation processing to the data output from the sense unit SU to the common line COM and collectively detects whether a plurality of sense units in the column block COL include a fail bit. The detection result (operation result, arithmetic result) is output to the control unit 10 through the signal lines NCOM and LSEN. Hereinafter, the signal line (third signal line) LSEN is also referred to as a detecting line LSEN.

Each of the detecting units FU includes two latch circuits, 50 and 70.

The first latch circuit 70 holds failure information of a predetermined unit set in the memory cell array 1. The failure information indicates whether a predetermined control unit set in the memory cell array 1 is passed or failed. The failure information is held by the latch circuit 70 by reading of data of a fuse (presence of meltdown of fuse) or data in a predetermined storage region in the chip at the time of activation of the chip, for example. Hereinafter, the failure information held by the latch circuit 70 is also referred to as fuse data.

In this embodiment, the failure information held by the latch circuit 70 is information of a failed column block (failed column flag), for example. The failed column flag indicates whether the column block corresponding to the detecting unit includes a failure. For example, the failed column flag at the "L" level indicates a case in which the column block corresponding to the detecting unit FU is passed (available or valid) and the failed column flag at the "H" level indicates a case in which the column block corresponding to the detecting unit FU is failed (not available or invalid).

When the latch circuit 70 holds the failed column flag at the "H" level, the column block COL corresponding to the same is electrically isolated by the control unit 10 so as not to be the operation target.

Hereinafter, the latch circuit 70, which holds the fuse data as the failure information (for example, failed column flag), is referred to as an isolation latch circuit 70.

Meanwhile, the latch circuit 70 may hold not only the failed column flag but also the failure information of another control unit set in the memory cell array such as the block.

The second latch circuit 50 has two input terminals and one output terminal. One input terminal of the latch circuit 50 is connected to the common line COM. The other input terminal of the second latch circuit 50 is connected to an output terminal of the isolation latch circuit 70. An output terminal of the second latch circuit 50 is connected to the signal line (second signal line) NCOM.

Hereinafter, the latch circuit 50 to which a signal of the common line COM is input is referred to as a COM latch circuit 50.

The COM latch circuit 50 performs the operation processing of the signal from the common line COM (verification result) and a signal from the isolation latch circuit 70 (fuse data). Then, the operation result (arithmetic result) is output to the signal line NCOM. The operation processing by the COM latch circuit 50 is a logical sum operation, for example.

Before and after the operation processing by the COM latch circuit 50, the two signal lines COM and NCOM connected to the COM latch circuit 50 indicate signal levels in a complementary relationship with each other.

In the semiconductor memory (for example, flash memory) of this embodiment, the latch circuit (COM latch circuit) 50 is connected to the common line COM to which a plurality of sense units SU are connected in common.

In the flash memory, miniaturization (shrinking) of the memory cell transistor is advanced so as to improve the storage density and reduce a manufacturing cost. In association with this, the miniaturization of the column control circuit and the like is also advanced.

Since the capacitance of a capacitor as a dynamic cache is designed in consideration of leak and the like, there is limitation in reduction of an area of the capacitor.

On the other hand, as in this embodiment, by using the latch circuit as a static cache, the transistor, which forms the latch circuit, may be miniaturized following the miniaturization of the memory cell transistor. As a result, areas of the detecting circuit (fail bit detecting circuit) and a peripheral circuit may be reduced.

As in this embodiment, by using the static cache such as the latch circuit as the cache connected to the common line COM, it is possible to contribute to a reduction in rate of failure (for example, rate of initial failure) of the memory and reduction in power consumption as compared to a case in which the dynamic cache such as the capacitor is used.

(b) Internal Configuration

The internal configuration of the column control circuit group 3 of the flash memory of this embodiment is described with reference to FIGS. 3 and 4. Meanwhile, it is herein described appropriately with reference to FIGS. 1 and 2.

Figure 3:
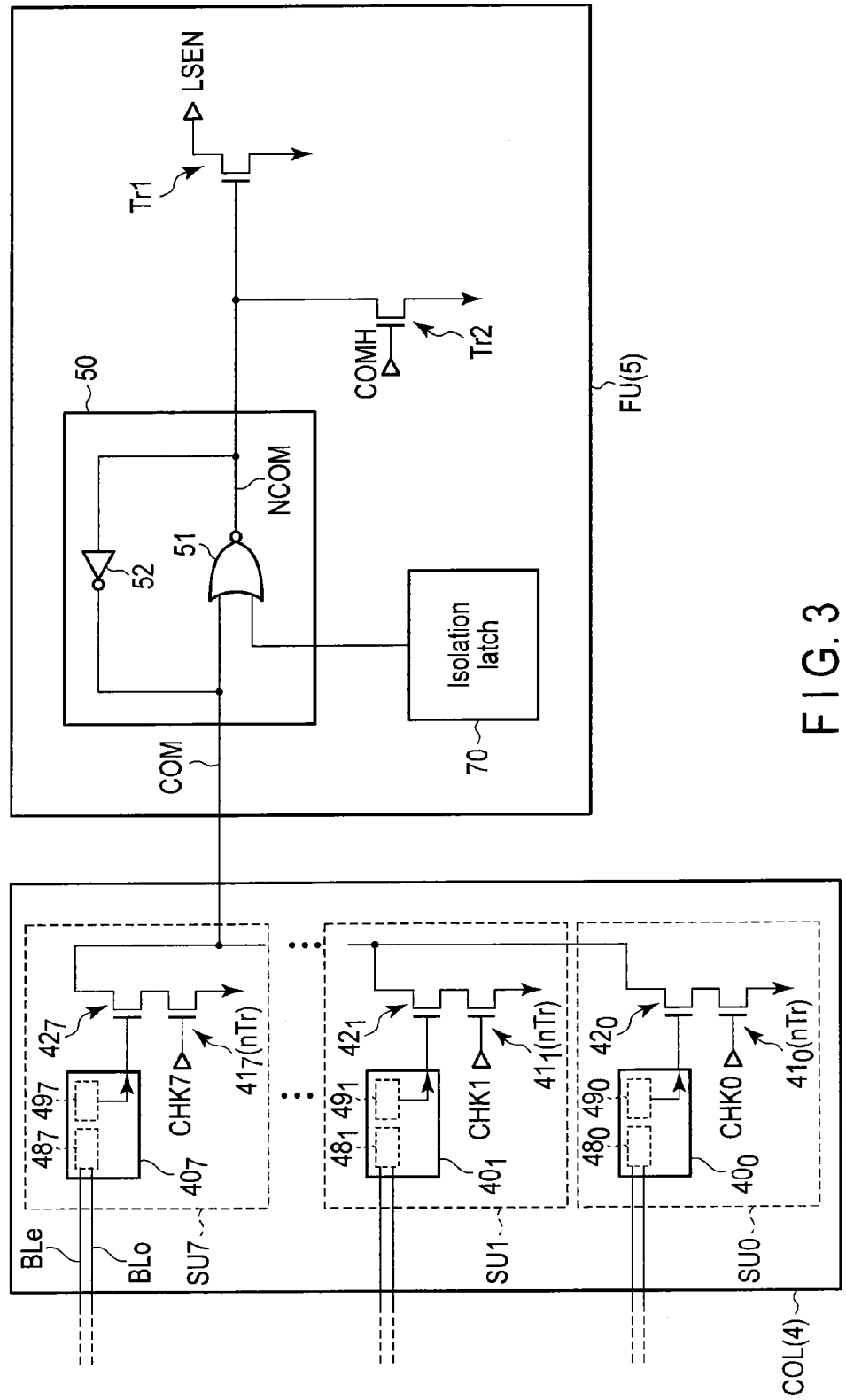
FIG. 3 is an equivalent circuit diagram of a circuit configuration example of the semiconductor memory of the first embodiment.

FIG. 3 illustrates the internal configurations of the sense amplifier circuit 4 and the fail bit circuit 5 in the column control circuit group 3 of the flash memory of this embodiment. FIG. 3 illustrates the internal configurations of one column block COL and one detecting unit FU connected to the same. FIG. 4 illustrates a more specific example of the internal configurations of the COM latch circuit 50 and the isolation latch circuit 70 in the detecting unit FU.

Eight sense units, SU0 to SU7 are provided, for example, in one column block COL.

The sense units SU0 to SU7 include sense amplifiers $40_0$ to $40_7$, field effect transistors $41_0$ to $41_7$, and field effect transistors $42_0$ to $42_7$, respectively. When the sense amplifiers $40_0$ to $40_7$ are not distinguished from one another, they are referred to as the sense amplifiers 40. Similarly, when the field effect transistors $41_0$ to $41_7$ are not distinguished from one another, they are referred to as the field effect transistors 41 and when the field effect transistors $42_0$ to $42_7$ are not distinguished from one another, they are referred to as the field effect transistors 42.

The bit line BL is connected to each of the sense amplifiers $40_0$ to $40_7$.

As described above, the even-numbered bit line BLe and the odd-numbered bit line BLo are connected to one sense amplifier 40. In this configuration, the sense amplifiers $40_0$ to $40_7$ are provided with bit line switching circuits $48_0$ to $48_7$, respectively. When the bit line switching circuits $48_0$ to $48_7$ are not distinguished from one another, they are referred to as the bit line switching circuits 48.

A connection status between the bit lines BLe and BLo and the sense amplifier 40 is controlled by the bit line switching circuit 48 such that either the even-numbered bit line BLe or the odd-numbered bit line BLo is electrically connected to the sense amplifier 40 according to the operation for the memory cell array 1.

The sense amplifiers $40_0$ to $40_7$ have data cache circuits $49_0$ to $49_7$ for holding the data, respectively. When the data cache circuits $49_0$ to $49_7$ are not distinguished from one another, they are referred to as the data cache circuits 49.

The data cache circuit 49 is connected to the bit line BL through the bit line switching circuit 48.

The data cache circuit 49 in the sense amplifier 40 temporarily holds the data from outside at the time of the writing, the data from the memory cell array at the time of the reading, the data at the time of the write verification, or the data at the time of the erase verification.

The data cache circuit 49 holds the result of the write verification and the result of the erase verification for each bit (memory cell transistor MT). Based on the result of the verification, when it is judged that the data writing or the data erasing is completed (pass), the data cache circuit 49 holds a signal at the "L" level. Further, when it is judged that the data writing or the data erasing is not completed (fail) in the result of the verification, the data cache circuit 49 holds the signal at the "H" level. Hereinafter, the signal indicating the result of the verification is also referred to as the verification result or pass/fail information.

Meanwhile, although an example in which pass or fail is indicated by the same signal level in the write verification and the erase verification is hereinafter described, it goes without saying that this embodiment may also be applied to a case in which pass or fail is indicated by the signal levels opposite to each other in the write verification and the erase verification according to the internal configuration of the sense amplifier 40.

The data cache circuit 49 is formed of a plurality of latches or capacitors. The number of latches or capacitors in the data cache circuit 49 differs according to a specification and the configuration of the flash memory such as whether the flash memory is the 2-level memory or the multilevel memory.

The field effect transistors $42_0$ to $42_7$ are the re-channel MOS transistors, for example. A gate of the MOS transistor 42 is connected to an output terminal of the sense amplifier 40. The data held by the data cache circuit 49 is transferred to the gate of the MOS transistor 42, for example.

One end of each of the current paths of a plurality of MOS transistors 42 is connected to the common line COM. According to this, a plurality of sense units SU in the column block COL are connected to the common line COM.

The field effect transistors $41_0$ to $41_7$ are the re-channel MOS transistors, for example. One end of a current path of the MOS transistor 41 is connected to the other end of the current path of the MOS transistor 42. The current path of the MOS transistor 41 is connected to the common line COM through the current path of the MOS transistor 42. The other end of the current path of the MOS transistor 41 is connected to ground. Signals CHK0 to CHK7 are input to gates of the MOS transistors $41_0$ to $41_7$, respectively. The MOS transistors $41_0$ to $41_7$ are controlled to be turned on or off by the signals CHK0 to CHK7, respectively. The MOS transistor 41 is turned on when it is detected whether the column block COL includes the verification fail. When the sense unit SU holds the data ("H") of the verification fail, the MOS transistor 42 discharges the common line COM.

The signals CHK0 to CHK7 are also referred to as check signals CHK0 to CHK7. Meanwhile, when the check signals CHK0 to CHK7 are not distinguished from one another, they are referred to as the check signals CHK.

Meanwhile, the two MOS transistors 41 and 42 the current paths of which are connected in series are sometimes referred to as a check circuit.

As described above, the detecting unit FU in the fail bit detecting circuit 5 is connected to a plurality of sense units SU0 to SU7 in one column block COL through the common line COM. The detecting unit FU has two latch circuits, 50 and 70.

The COM latch circuit 50 includes a NOR gate 51 and an inverter (NOT gate) 52, for example.

The NOR gate 51 has two input terminals and one output terminal as the input/output terminals of the latch circuit 50. One input terminal (first input terminal) of the NOR gate 51 is connected to the common line COM. The other input terminal (second input terminal) of the NOR gate 51 is connected to the output terminal of the isolation latch circuit 70. The output terminal of the NOR gate 51 is connected to the signal line NCOM.

An input terminal of the inverter 52 is connected to the signal line NCOM. According to this, the output terminal of the NOR gate 51 is connected to the input terminal of the inverter 52 and an output signal of the NOR gate 51 is input to the inverter 52. An output terminal of the inverter 52 is connected to the common line COM. According to this, the output terminal of the inverter 52 is connected to one input terminal of the NOR gate 51 and an output signal of the inverter 52 is input to the NOR gate 51.

As illustrated in FIG. 4, the COM latch circuit 50 is formed of six field effect transistors 110, 111, 112, 114, 121, and 122.

The NOR gate 51 is formed of two p-channel MOS transistors 110 and 111 and two n-channel MOS transistors 112 and 114, for example.

When the signal (fuse data) from the isolation latch circuit 70 is at the "L" level, the NOR gate 51 substantially serves as a CMOS inverter 101 formed of the p-channel MOS transistor 111 and the n-channel MOS transistor 112.

Gates of the MOS transistors 111 and 112 are connected to each other to form an input node. The gates of the MOS transistors 111 and 112 are connected to the output terminal of the isolation latch circuit 70. Drains of the MOS transistors 111 and 112 are connected to each other to form an output node. One end (drain) of each of current paths of the MOS transistors 111 and 112 is connected to the signal line NCOM. The other end (source) of the current path of the n-channel MOS transistor 112 is connected to a ground end. The other end (source) of the current path of the p-channel MOS transistor 111 is connected to a power supply Vdd through a current path of the p-channel MOS transistor 110.

One end of the p-channel MOS transistor 110 is connected to the power supply Vdd and the other end of the p-channel MOS transistor 110 is connected to the other end (source) of the current path of the p-channel MOS transistor 111. A gate of the p-channel MOS transistor 110 is connected to the common line COM.

One end of a current path of the n-channel MOS transistor 114 is connected to the signal line NCOM and the other end of the current path of the n-channel MOS transistor 114 is connected to the ground end. A gate of the n-channel MOS transistor 114 is connected to the gate of the p-channel MOS transistor 110. Further, the gate of the MOS transistor 114 is connected to the common line COM and an output node of the inverter 52.

The gates of the MOS transistors 110 and 114 correspond to one input terminal of the NOR gate. The connected gates of the MOS transistors 111 and 112 correspond to the other input terminal of the NOR gate 51 and the connected drains of the MOS transistors 111 and 112 correspond to the output terminal of the NOR gate 51.

The NOR gate 51 performs the logical sum operation (NOR operation) of a signal corresponding to a potential of the common line COM and the fuse data held by the isolation latch circuit 70, and the operation result is output to the signal line NCOM.

The inverter 52 is the CMOS inverter, for example. That is to say, the inverter 52 is formed of the p-channel MOS transistor 121 and the n-channel MOS transistor 122.

A gate of the p-channel MOS transistor 121 and a gate of the n-channel MOS transistor 122 are connected to each other to form an input node of the inverter 52. One end (drain) of a current path of the p-channel MOS transistor 121 and one end (drain) of a current path of the n-channel MOS transistor 122 are connected to each other to form the output node of the inverter 52. The other end (source) of the current path of the p-channel transistor 121 is connected to the power supply Vdd. The other end (source) of the current path of the n-channel MOS transistor 122 is connected to the ground end.

The input node of the inverter 52 is connected to the output node of the MOS transistors 111 and 112 and one end of the current path of the n-channel transistor 114 of the NOR gate 51. The input node of the inverter 52 is also connected to the signal line NCOM.

The output node of the inverter 52 is connected to the gate of the p-channel MOS transistor 110. Further, the output node of the inverter 52 is connected to the common line COM and the gate of the n-channel MOS transistor 114.

The output signal (operation result, arithmetic result) of the NOR gate 51 is inverted by the inverter 52 and the inverted signal is input to the NOR gate 51. According to this, the latch circuit 50 holds (latches) the data.

A current driving force of the p-channel MOS transistor 122 in the inverter 52 is smaller than the current driving force of each n-channel MOS transistor 41 in the check circuit in the sense unit SU.

According to this, when the column block COL includes the verification fail, a discharge current from the common line COM flowing through a channel of the MOS transistor 41 becomes larger than the current flowing through the inverter 52, so that it is possible to forcedly invert the signal level of the common line COM from the "H" level to the "L" level.

Magnitudes of the current driving force of the p-channel MOS transistor 122 in the inverter 52 and that of the n-channel MOS transistor 41 in the sense unit SU are set by an operation stabilization point between the two transistors 122 and 41. The current driving force of the MOS transistor 122 and that of the MOS transistor 41 are controlled by changing the dimensions of the MOS transistor, for example, a channel length of the MOS transistor. For example, when the channel length of the MOS transistor is increased, the current driving force decreases. Meanwhile, the current driving force of the n-channel MOS transistor 42 is comparable to the current driving force of the MOS transistor 41, for example. In this manner, the current driving force of the n-channel MOS transistors 41 and 42, which form the check circuit, is larger than the current driving force of the p-channel MOS transistor, which forms the inverter 52.

The isolation latch circuit 70 holds the failure information (for example, failed column flag) in the memory cell array 1. FIG. 4 illustrates an example of the internal configuration of the isolation latch circuit 70.

The isolation latch circuit 70 has a flip-flop FF as the latch (cache). The flip-flop FF is formed of two inverters 174 and 175, which are flip-flop connected. The inverters 174 and 175 are the CMOS inverter, for example. The flip-flop FF has two input terminals and one output terminal.

Three field effect transistors, 171, 172, and 173 are connected to the flip-flop FF. The field effect transistors 171, 172, and 173 are the n-channel MOS transistors, for example. Meanwhile, the number of MOS transistors connected to the flip-flop FF is not limited to three.

A signal FCEN is input to a gate of the MOS transistor 171. A signal CSL is input to a gate of the MOS transistor 172. A signal FCRST is input to a gate of the MOS transistor 173. The transistors 171, 172, and 173 are controlled to be turned on and off by the signals FCEN, CSL, and FCRST, respectively.

One end of a current path of the MOS transistor 171 is connected to the flip-flop FF through a current path of the MOS transistor 172. The other end of the current path of the MOS transistor 171 is connected to the ground end.

One end of the current path of the MOS transistor 172 is connected to one input terminal of the flip-flop FF. More specifically, one end of the current path of the MOS transistor 172 is connected to an output node of the inverter 174 and an input node of the inverter 175. The other end of the current path of the MOS transistor 172 is connected to the ground end through the MOS transistor 171.

One end of a current path of the MOS transistor 173 is connected to the other input terminal of the flip-flop FF. More specifically, one end of the current path of the MOS transistor 173 is connected to an input node of the inverter 174 and an output node of the inverter 175. The other end of the current path of the MOS transistor 173 is connected to the ground end.

In this manner, the MOS transistor 173 is connected to the input terminal of the flip-flop FF other than the input terminal to which the MOS transistors 171 and 172 are connected.

By discharging the nodes of the inverters 174 and 175 by turning on/off the MOS transistors 171, 172, and 173, the data held by the flip-flop FF ("H" or "L") is rewritten.

The output terminal of the flip-flop FF is connected to the input node of the MOS transistors 111 and 112 in the NOR gate 50.

Meanwhile, a circuit configuration of the isolation latch circuit 70 is not limited to the configuration illustrated in FIG. 4.

As illustrated in FIGS. 3 and 4, the detecting unit FU includes two field effect transistors Tr1 and Tr2 as switching devices in addition to the two latch circuits 50 and 70. The field effect transistors Tr1 and Tr2 are the n-channel MOS transistors, for example.

A gate of the MOS transistor Tr1 is connected to the output terminal of the COM latch circuit 50 through the signal line NCOM. One end of a current path of the MOS transistor Tr1 is connected to the signal line (detecting line) LSEN. The other end of the current path of the MOS transistor Tr1 is connected to the ground end. The MOS transistor Tr1 is controlled to be turned on and off by the potential (signal level) of the signal line NCOM.

A signal (referred to as a reset signal) COMH is input to a gate of the MOS transistor Tr2. The MOS transistor Tr2 is controlled to be turned on and off by the reset signal COMH. One end of a current path of the MOS transistor Tr2 is connected to the signal line NCOM and the other end of the current path of the MOS transistor Tr2 is connected to the ground end. Meanwhile, a connecting site of the current path of the MOS transistor Tr2 and the signal line NCOM is not limited to the site illustrated in FIG. 4, and this may be provided between the connecting site of the input node of the inverter 52 and the signal line NCOM and the output terminal of the NOR gate 51.

When the MOS transistor Tr2 is turned on, the signal line NCOM is connected to the ground end and the signal line NCOM is discharged. In this case, the potential (signal level) of the signal line NCOM reaches the "L" level. When the signal line NCOM reaches the "L" level, the signal at the "H" level is input to the common line COM by inversion of the signal by the inverter 52. According to this, the common line COM is charged. On the other hand, when the common line NCOM reaches the "H" level, the signal at the "L" level is input to the common line COM by the inversion of the signal by the inverter 52.

Further, according to whether the potential of the common line COM is at the "L" level or the "H" level, the potential of the signal line NCOM changes by the operation result (arithmetic result) of the NOR gate 51.

(c) Operation

Hereinafter, the operation of the semiconductor memory (for example, flash memory) of the first embodiment is described with reference to FIGS. 1 to 5. Meanwhile, although a case in which the memory cell transistor stores the 2-level ("0" or "1") data is herein described, it goes without saying that this embodiment may be applied also to a case in which the memory cell transistor stores the multilevel data.

<Read Operation>

The read operation of the flash memory of this embodiment is described next.

The command to request the reading is input from outside to the control unit 10 and the read operation is executed. Together with the input of the command, the address indicating the selected block, a selected row (selected word line), and a selected column (selected bit line) being the reading target is input to the control unit 10.

As illustrated in FIGS. 1 to 4, when the odd-numbered bit line BLo and the even-numbered bit line BLe are connected to one sense unit SU, one of the odd-numbered and even-numbered bit lines is driven by the bit line switching circuit 48. Meanwhile, the read operation for the odd-numbered bit line and the read operation for the even-numbered bit line are substantially the same.

In the read operation of the flash memory, the selected bit line is precharged to the voltage Vdd, for example. When the even-numbered bit line BLe is selected, the odd-numbered bit line BLo, which is not selected, is charged to the non-selected voltage.

Then, the reading voltage VCGR is applied to the selected word line WL. On the other hand, the non-selected potential VREAD is applied to the non-selected word line WL.

In one NAND cell unit NU, when the threshold voltage of the memory cell transistor MT connected to the selected word line WL is not higher than the reading voltage VCGR, the memory cell transistor MT is turned on. The memory cell transistor MT connected to the non-selected word line WL is turned on by the voltage VREAD.

In this case, all the memory cell transistors MT in the NAND cell unit NU are turned on. According to this, the charge of the selected bit line BL is discharged to the source line SL through the channel of the memory cell transistor MT in an on-state.

On the other hand, when the threshold voltage of the memory cell transistor MT connected to the selected word line WL is higher than the reading voltage VCGR, the memory cell transistor MT is turned off.

In this case, the selected bit line BL is not substantially discharged by the memory cell transistor in an off-state and the potential of the selected bit line BL is maintained at the charging potential.

The potential (charge) of the selected bit line BL is captured in the cache circuit 49 in the sense unit 40. According to this, the data is held in the sense unit SU according to the potential (charging or discharging) of the selected bit line BL.

Meanwhile, in a case of the multilevel memory (4-level memory, for example), operations to capture an upper-bit in the cache circuit and capture a lower-bit in the cache circuit by applying a voltage corresponding to the threshold voltage are executed.

The data held by the sense unit SU is output to the data input/output circuit 11 through the data line DL to be read to outside by the control unit 10.

As described above, the read operation of the flash memory of this embodiment is executed.

<Write Operation>

The write operation of the flash memory of this embodiment is described next.

The write operation of the NAND flash memory is executed by using the page PG as a unit of writing.

As with the read operation, the command to request the writing and the address of the writing target are input from outside to the control unit 10 and the write operation is executed. Further, the data, which should be written, is input to the sense amplifier circuit 4 through the data input/output circuit 11 and the data is captured in the cache circuit 49 in a predetermined sense unit SU.

The potential of the selected bit line BL is controlled according to the data written to the memory cell transistor MT. The voltage Vdd is applied to the bit line BL connected to the memory cell transistor MT to which the "1" data is written. The ground potential is applied to the bit line BL connected to the memory cell transistor MT to which the "0" data is written.

The writing voltage VPGM is applied to the selected word line and a predetermined potential such as the non-selected potential VPASS is applied to the non-selected word line.

When the potential of the bit line BL is set at the ground potential, a threshold level of the memory cell transistor MT transitions by the injection of the charge into the charge storage layer and the "0" data is written to the memory cell transistor MT, which is the writing target.

On the other hand, when the potential of the bit line BL is set at the voltage Vdd, in the memory cell transistor MT, which is not the writing target, a potential difference between the gate electrode thereof (selected word line) and the channel is smaller than the potential difference for writing the "0" data, so that the injection of the charge into the charge storage layer such that the threshold of the memory cell transistor MT varies does substantially not occur.

As a result of this, when the potential of the bit line BL is set at the voltage Vdd, the memory cell transistor MT connected to the bit line BL maintains a holding state (erased state) of the "1" data.

Thereafter, the verification (hereinafter, write verification) for verifying whether predetermined data is written is executed.

In the write verification, the read operation (referred to as verify-reading) is executed for the memory cell transistor MT to which the data is written, and it is verified whether the data read by the verification and the data from outside conform to each other.

When the data, which is verify-read, and the data from outside conform to each other, it is judged as pass (verification pass) and the signal at the "L" level is stored in the cache circuit 49 in the sense unit SU, for example.

When the data, which is verify-read, and the data from outside do not conform to each other, it is judged as fail (verification fail) and the signal at the "H" level is stored in the cache circuit 49 in the sense unit SU, for example.

For example, as the reading voltage of the verify-reading, the voltage slightly higher than the reading voltage of a normal read operation is used.

It is judged whether the write operation is completed based on the result of the write verification, for example, the number of verification fails. The judgment of the verification (detection of verification pass/fail) is to be described later.

When it is judged that the writing is completed, the control unit 10 notifies an external unit (host or memory controller) of completion of the write operation.

When it is judged that the writing is not completed, the data writing to the selected word line and the write verification are executed again. For example, a loop of the data writing and the write verification (hereinafter, referred to as writing loop) is repeated until it is judged that the writing is completed. However, when it is not judged that the writing is completed after the writing loop is executed a predetermined number of times, it is possible to judge that the page PG or the block BLK including the page PG is failed and execute the write operation to another page PG or another block BLK.

As described above, the write operation of the flash memory of this embodiment is executed.

<Erase Operation>

The erase operation of the flash memory of this embodiment is described next.

The erase operation of the NAND flash memory is executed using the block BLK as a unit of erasing.

At the time of the erase operation, 0 V is applied to all the word lines WL in the block BLK and the positive voltage VERA of approximately 20 V is applied, for example, to the region (well region) in which the memory cell transistor MT is formed. According to this, the charge in the charge storage layer is emitted in the well region.

Then, the erase verification for verifying whether the memory cell transistor is put into the erased state ("1" data holding state) is executed.

The erase verification is alternately executed for the odd-numbered bit line BLo and the even-numbered bit line BLe and it is verified whether the memory cell transistor MT is in the erased state for both of the odd-numbered bit line BLo and the even-numbered bit line BLe.

As an example of the erase verification, in a state in which the bit line BL is discharged, the reading voltage VCGR for the memory cell transistor in the erased state is applied to all the word lines WL.

When all the memory cell transistors MT connected to the common bit line BL are in the erased state, the memory cell transistors MT are turned on by the voltage VCGR and the bit line BL is charged with supply of the potential from the source line SL.

On the other hand, when there is the memory cell transistor MT, which is not in the erased state, in a plurality of memory cell transistors MT connected to the common bit line BL, the memory cell transistor, which is not in the erased state, is in the off-state even when the voltage VCGR is applied. Therefore, a discharged state of the bit line BL is maintained.

In this manner, in the erase verification, it is judged whether the verification passes ("L" level) or the verification fails ("H" level) by sensing the charged state or the discharged state of the bit line BL. In the erase verification also, the verification result ("L" or "H" level) is stored in the cache circuit 49 in the sense unit SU. The judgment of the verification is to be described later.

It is judged whether the erase operation is completed based on the result of the erase verification.

When it is judged that the erase operation is completed, the control unit 10 notifies the external unit (host or memory controller) of completion of the erase operation for the selected block BLK.

When it is judged that the erase operation is not completed, the control unit 10 executes the erase operation for the selected block BLK again. Meanwhile, when the selected block is not put into the erased state after the erase operation is executed a predetermined number of times, it is possible to treat the block BLK as the failed block.

As described above, the erase operation of the flash memory of this embodiment is executed.

<Fail Bit Detecting Operation>

Operation of the fail bit detecting circuit at the time of the verification, that is to say, fail bit detecting operation based on the verification result at the time of the data writing and the data erasing in the flash memory of the first embodiment is described with reference to FIG. 5. Herein, the operation is described appropriately with reference to FIGS. 1 to 4 in addition to FIG. 5.

Meanwhile, although the operation of one column block COL and one detecting unit FU is described in order to simplify the description, it goes without saying that the similar operation of a plurality of column blocks and a plurality of detecting units FU may be executed in parallel.

FIG. 5 illustrates a timing chart of the fail bit detecting operation in the flash memory of this embodiment.

In the flash memory of this embodiment, if even one of a plurality of sense units SU in the column block COL stores the data indicating the verification fail, it is judged that the data writing or the data erasing is not completed.

As described above, at the time of the write operation or the erase operation, the verification is executed for the memory cell transistor MT, which is the operation target, and the verification result (pass/fail information at "H" or "L" level) is stored in each sense unit SU.

For example, the signal, which indicates that the verification result in the data writing or the data erasing is pass (verification pass), is indicated by the "L" level and the signal, which indicates that the verification result in the write operation or the erase operation is fail (verification fail), is indicated by the "H" level.

Meanwhile, in an initial state before the fail bit detecting operation, the potential of the common line COM and the signal line NCOM may be at either the "L" level or the "H" level if they are in a complementary relationship with each other.

First, when judging the verification result, the data holding state of the COM latch circuit 50 is reset by the reset signal COMH.

As illustrated in FIG. 5, the signal level of the signal COMH transitions from the "L" level to the "H" level. By the transition of the signal COMH, the n-channel MOS transistor Tr2 connected to the signal line NCOM is turned on. When the signal line NCOM is in the charged state ("H" state), the charge of the signal line NCOM is discharged by the MOS transistor Tr2, which is turned on. According to this, the potential (signal level) of the signal line NCOM reaches the "L" level.

On the other hand, the potential of the signal line NCOM is input to the inverter 52 in the latch circuit 50 as an input signal. The signal (potential) at the "L" level of the signal line NCOM is inverted by the inverter 52 and the signal (potential) at the "H" level is output to the signal line (common line) COM. According to this, the common line COM is charged to the "H" level.

In this manner, the common line COM indicates the "H" level and the signal line NCOM indicates the "L" level. Meanwhile, when the signal line NCOM is in the discharged state ("L" level), before and after the turning-on of the n-channel MOS transistor Tr2, the common line COM indicates the "H" level and the signal line NCOM indicates the "L" level. Meanwhile, the potential of the detecting line LSEN is set at the "H" level in the initial state.

By setting the reset signal COMH at the "H" level, the data holding state of the latch circuit 50 is reset. At that time, only the current for resetting the latch circuit 50 (referred to as reset current) is instantaneously generated in order to invert the data held by the latch circuit 50, and the reset current is smaller than the current for charging the capacitor as the cache connected to the common line COM.

After the latch circuit 50 is reset, the reset signal COMH is changed from the "H" level to the "L" level.

Herein, the signal at the "H" level as the potential of the common line COM and the fuse data (for example, failed column flag) held by the isolation latch circuit 70 are input to the COM latch circuit 50 in the detecting unit FU.

The fuse data as the failed column flag indicates the "H" level when the column block COL corresponding to the isolation latch circuit 70 is failed and indicates the "L" level when the column block COL is not failed (passed).

After the transition of the potential of the common line COM to the "H" level and the transition of the potential of the signal line NCOM to the "L" level, the control unit 10 causes the transition of all the check signals CHK from the "L" level to the "H" level. According to this, the n-channel MOS transistor 41 in each sense unit SU is turned on.

Further, each of the sense amplifiers 40 in the column block COL holds either the signal at the "H" level or the signal at the "L" level as the verification result of each bit (memory cell transistor MT). Therefore, out of the n-channel MOS transistors 42 of which gate is connected to the sense amplifier 40, the MOS transistor 42 to which the signal at the "H" level (verification fail) is input is turned on. Out of the n-channel MOS transistors 42, the MOS transistor 42 to which the signal at the "L" level (verification pass) is input is not turned on and the off-state thereof is maintained.

The potential of the common line COM at the "H" level is discharged to the ground end through the current path of the MOS transistor 42 turned on by the signal indicating the verification fail and the current path of the MOS transistor 41 turned on by the control signal CHK.

Therefore, if even one of a plurality of sense units SU in the column block COL holds the data of the verification fail ("H"), the signal level of the common line COM transitions from the "H" level to the "L" level.

When all of a plurality of sense units SU in the column block COL hold the data of the verification pass ("L"), the signal level of the common line COM is maintained at the "H" level.

In this manner, when the verification results of all the sense units SU in the column block COL are pass, that is to say, when the verification result of the column block COL is pass, the signal level of the common line COM is at the "H" level. On the other hand, when the verification result of one or more sense units SU out of a plurality of sense units SU in the column block COL is fail, that is to say, when the verification result of the column block COL is fail, the signal level of the common line COM is at the "L" level.

Herein, in a case in which the fuse data held by the isolation latch circuit 70 is at the "L" level, when the signal level of the common line COM reaches the "L" level, both of the two input signals to the NOR gate 51 in the COM latch circuit 50 is the "L" level. Therefore, the output (operation result, arithmetic result) of the NOR gate 51 reaches the "H" level and the signal level of the signal line NCOM is changed from the "L" level to the "H" level following the change in the signal level of the common line COM (from "H" to "L").

In this manner, the verification results held by a plurality of sense units SU included in the column block COL are collectively output in units of column blocks COL to be reflected in the signal level of the common line COM. When the verification result of the column block COL is fail ("H" level), the data held by the COM latch circuit 50 is inverted by the discharge of the common line COM. As described above, in the inverter 52 in the COM latch circuit 50, the current driving force of the p-channel MOS transistor 121 to form the inverter 52 is smaller than the current driving force of the n-channel MOS transistor 41 in each sense unit SU. According to this, it is possible to forcedly invert the data held by the COM latch circuit 50 by the discharge current by the discharge of the common line COM.

Meanwhile, as described above, when the column block COL is failed, the failed column block is electrically separated by the control unit 10 to be isolated from the operation target.

Further, when the fuse data is at the "H" level, the output result of the NOR gate 51 is at the "L" level (pass), so that even when the judgment of the verification pass/fail is executed for the failed column block, the failed column block does not negatively affect the detecting operation.

When the signal level of the signal line NCOM reaches the "H" level, the n-channel MOS transistor Tr1 having the gate connected to the signal line NCOM is turned on.

The charge of the detecting line LSEN is discharged to the ground end through the current path of the MOS transistor Tr1, which is turned on. Therefore, the signal level of the detecting line LSEN transitions from the "H" level to the "L" level.

When the signal level of the signal line NCOM is at the "L" level, the n-channel MOS transistor Tr1 is not turned on. Therefore, the charged state ("H" level state) of the detecting line LSEN is maintained.

When the signal level of the common line COM is at the "L" level and the signal level of the signal line NCOM is at the "H" level, the verification result of the column block COL corresponding to the same is fail. On the other hand, when the signal level of the common line COM is at the "H" level and the signal level of the signal line NCOM is at the "L" level, the verification result of the column block COL is pass. Therefore, it is possible to detect whether the verification result of the column block COL and the sense units SU included therein is pass or fail by presence of the discharge of the detecting line LSEN.

Further, as illustrated in FIG. 2, the detecting line LSEN is connected to a plurality of column blocks COL through a plurality of detecting units FU. If there is even one column block COL the verification result of which is fail in a plurality of column blocks COL connected to the common detecting line LSEN, the detecting line LSEN is discharged by the MOS transistor Tr1, which is turned on. Therefore, when the signal level of the detecting line LSEN reaches the "L" level, it is judged that the data writing or the data erasing is not completed.

On the other hand, when the signal level of the detecting line LSEN is at the "H" level, the verification passes in all the sense units SU, so that it is judged that the data writing or the data erasing in the operation sequence is completed.

In this manner, by sensing a variation in the potential of the detecting line LSEN, it is collectively detected whether a plurality of sense units SU in the column block COL include the verification fail.

As described above, it is judged whether the write operation and the erase operation are completed based on the verification result held by a plurality of sense units SU of the column block COL.

Also in a case in which the latch circuit 50 is used in the detecting unit FU for detecting fail or pass of the operation for the memory cell transistor MT as in the flash memory of this embodiment illustrated in FIGS. 1 to 4, fail or pass of the operation may be judged based on the verification result.

Meanwhile, although the detecting operation of the verification fail is herein described focusing on one detecting unit, it goes without saying that the above-described operation may be simultaneously performed for all the column blocks set in the memory cell array to collectively detect whether the verification fail is included.

(d) Summary

A certain control unit (column block) COL is allocated to a plurality of columns of the memory cell array in the semiconductor memory, for example, the flash memory of the first embodiment. A plurality of column blocks are allocated in the column direction of a plurality of memory cell arrays.

A predetermined number of sense units SU in the sense amplifier circuit 4 are included in one column block COL. In this embodiment, it is judged whether the write operation or the erase operation is completed by detecting whether the sense unit SU in the column block COL holds the data of the verification fail.

The detecting circuit (fail bit detecting circuit) for detecting the verification result includes a plurality of detecting units. One detecting unit FU corresponds to one column block COL. The detecting unit FU is connected in common to a plurality of sense units SU in the column block COL by the common line COM.

In this embodiment, the latch circuit 50 is used as the cache connected to the common line COM corresponding to the column block COL.

There is a case in which the dynamic cache such as the capacitor is used as the cache connected to the common line COM. Since the capacitance of the capacitor as the dynamic cache is designed in consideration of the leak and the like of the MOS transistor for controlling the charge and the discharge of the capacitor, there is limitation of the reduction in the area of the capacitor. Further, it is necessary that the capacitance of the capacitor is sufficiently larger than the interconnect capacitance of the common line COM in order to reduce interconnect noise. Therefore, when an interconnect width is shrank the interconnect capacitance of the common line COM increases, so that an area occupied by the capacitor as the dynamic cache increases.

Further, as the miniaturization of the flash memory is advanced, a crystal defect randomly generated in a wafer might deteriorate characteristics of the device such as the MOS transistor. At the time of the above-described detecting operation of the verification result of the flash memory, there is a case in which the capacitor connected to the common line COM is discharged by the leak current of the MOS transistor by the crystal defect. Therefore, there is a case in which, even when the column block COL does not include the verification fail, it is judged in error that the verification fails due to the discharge of the common line COM. Since the detecting line LSEN is connected in common to a plurality of column blocks COL, even when the capacitor discharges by the leak current in just one column block COL, this causes the failure of an entire circuit. Therefore, the rate of failure of the flash memory is deteriorated.

Further, in the detecting operation of the verification result, the charge and the discharge of the capacitor connected to the common line COM are executed. Since the charge operation and the discharge operation are simultaneously executed for all the column blocks, thousands of capacitors are simultaneously charged or discharged. Therefore, a peak current or power-supply noise resulting from the charge/discharge of the capacitor might negatively affect the operation of the flash memory.

Further, when the capacitor is used, it is necessary to design the circuit in consideration of the power-supply noise such as a drop in voltage of an internal power supply.

On the other hand, when the latch circuit 50 is used as the cache as in this embodiment, even when the leak current of approximately tens of nA is generated in the common line COM and the signal line NCOM, the current supply capacity of the latch circuit 50 is larger than the leak current. Therefore, the latch circuit 50 may normally hold the data even when the leak current of the common lines COM and NCOM is generated. Further, by using the latch circuit 50 as the static cache, it is possible to miniaturize the transistor, which forms the latch circuit, following the miniaturization of the memory cell transistor MT. Especially, in the flash memory, as the miniaturization of the gate length of the memory cell transistor MT is advanced from 40 nm to 10 nm in order to improve the storage density and reduce the manufacturing cost, the latch circuit 50 may ensure reliability of the operation as compared to the capacitor and may reduce a relative area.

As described above, the data holding state of the latch circuit 50 connected to the common line COM is switched by the discharge of the common lines COM and NCOM, so that the charge operation of the latch circuit 50 becomes not necessary. Further, the current generated when the data of the latch circuit 50 is switched is only the instantaneous current generated when the data is inverted, and this is sufficiently smaller than the current generated by the charge and the discharge of the capacitor.

Further, the current driving force of the p-channel transistor of the CMOS inverter 52 in the latch circuit 50 is made smaller than the current driving force of the n-channel MOS transistors 41 and 42 of the check circuit in the sense unit SU. According to this, the data holding state of the latch circuit 50 is forcedly switched by the discharge of the common line COM.

Therefore, by using the latch circuit 50 as the cache of a failure detecting circuit, the noise may be reduced and the power consumption of the flash memory may be reduced as compared to the case in which the capacitor is used.

Further, by using the latch circuit 50, it is possible to ease limitations in the circuit design resulting from the noise such as the internal power supply drop and to improve design margin of the circuit.

As described above, according to this embodiment, it is possible to contribute to improved reliability of the memory and to reduce the power consumption.

(2) Second Embodiment

A semiconductor memory of a second embodiment is described with reference to FIGS. 6 to 16. An entire configuration of the semiconductor memory of the second embodiment is similar to that of the first embodiment, so that differences between the embodiments are herein mainly described.

In the second embodiment, common reference numerals are assigned to configurations substantially the same as configurations described in the first embodiment, and configurations and functions thereof are described as needed.

(a) Circuit Configuration

A circuit configuration of the semiconductor memory (for example, flash memory) of the second embodiment is described with reference to FIGS. 6 and 7.

Figure 6:
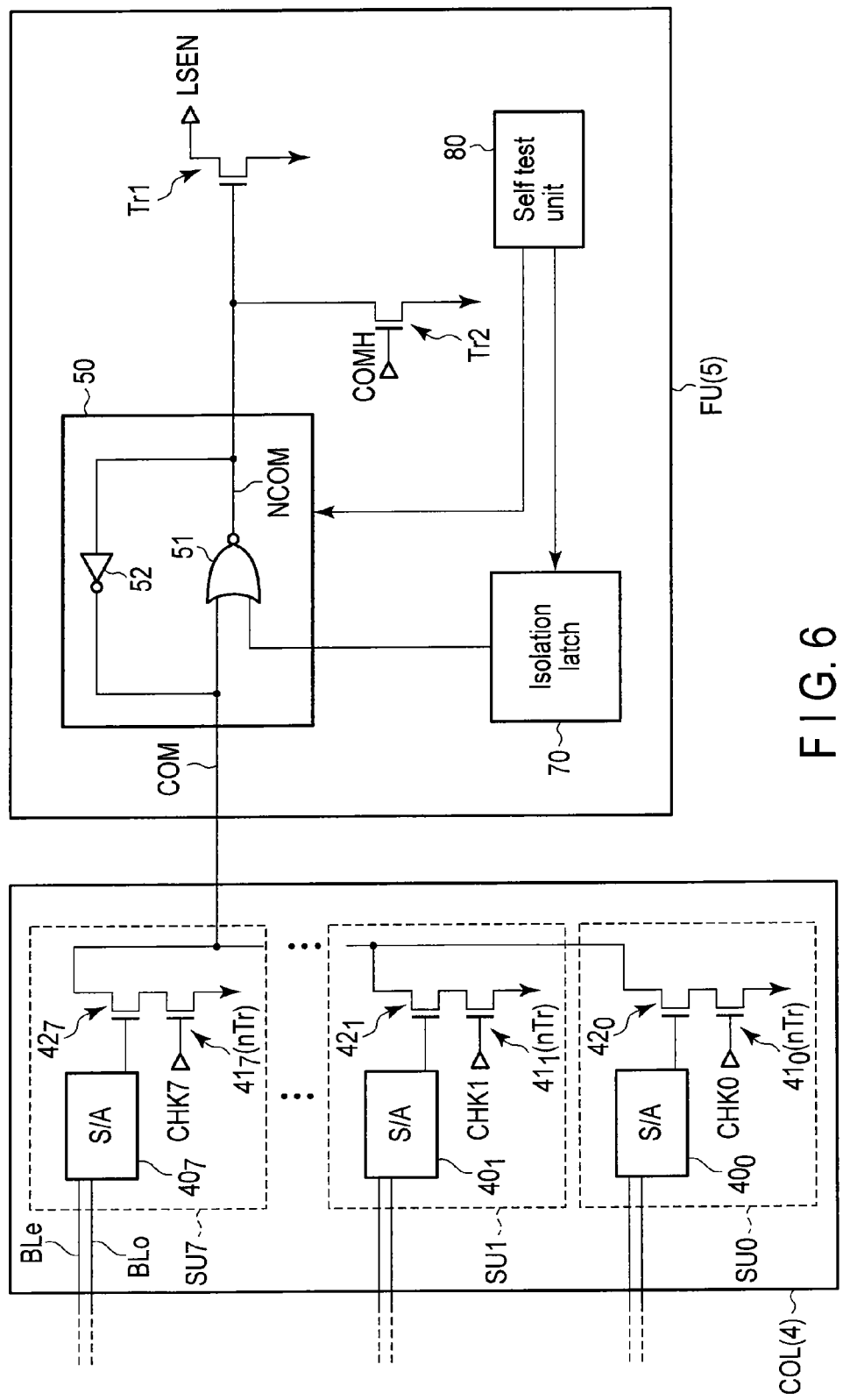
FIG. 6 is a block diagram of an internal configuration example of a semiconductor memory of a second embodiment.

FIG. 6 is a block diagram schematically illustrating the configuration of the semiconductor memory of this embodiment. FIG. 7 is an equivalent circuit diagram illustrating the configuration of the semiconductor memory of this embodiment more specifically.

As illustrated in FIG. 6, in the semiconductor memory of this embodiment, each detecting unit FU in a fail bit detecting circuit 5 further includes a self test unit 80. By the self test unit 80, it is tested whether the detecting unit FU and another configuration connected to the same include a failure.

For example, the self test unit 80 tests whether latch circuits 50 and 70 and signal lines COM and NCOM connected to the latch circuits 50 and 70 include the failure.

Figure 7:
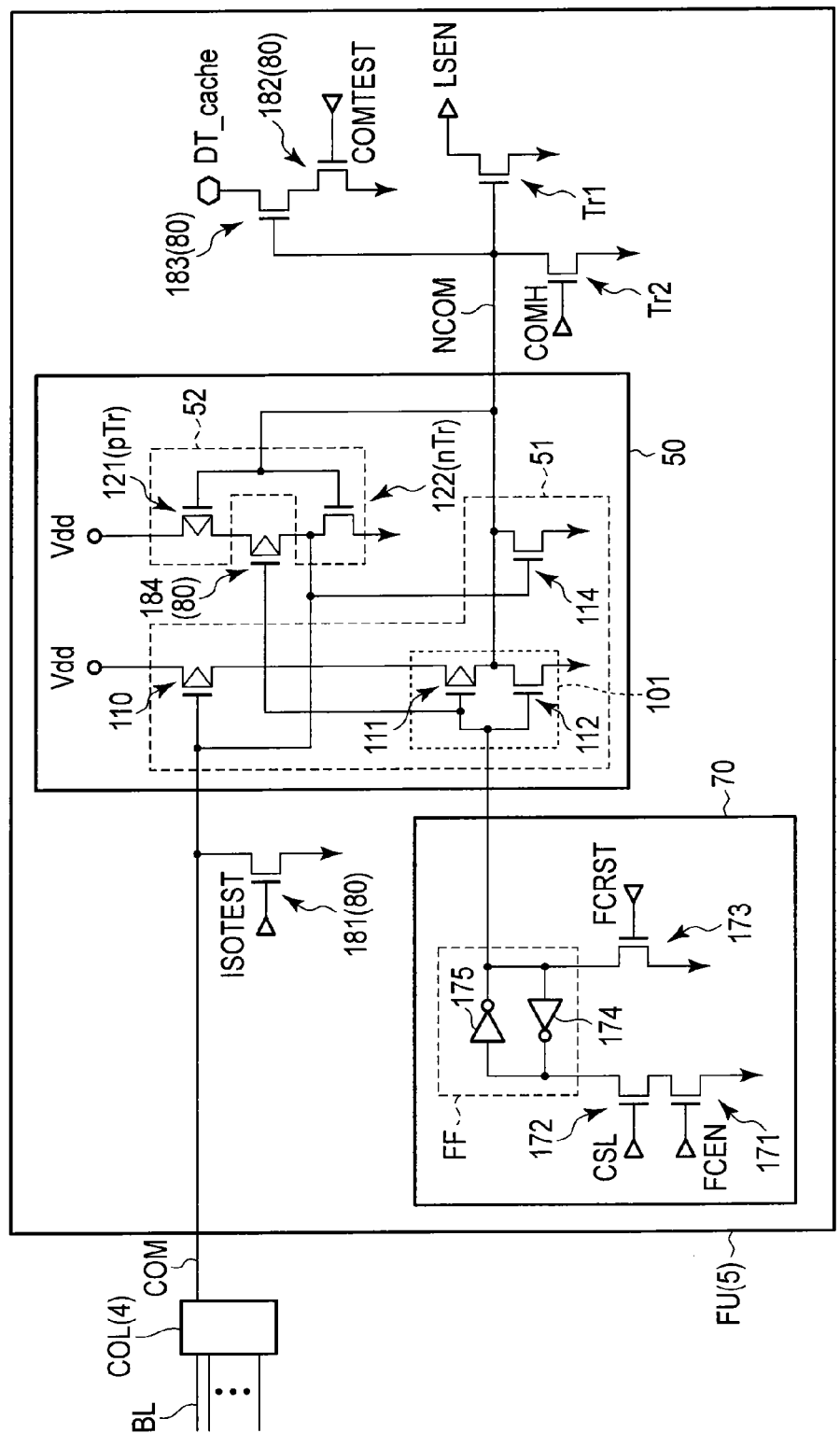
FIG. 7 is an equivalent circuit diagram of a circuit configuration example of the semiconductor memory of the second embodiment.

FIG. 7 illustrates an example in which a built-in self test (BIST) unit as the self test unit 80 is added to the detecting unit FU illustrated in FIG. 4. According to this, the detecting unit FU has a BIST function.

By adding four field effect transistors 181, 182, 183, and 184 as switching devices, for example, to the detecting unit FU, the BIST unit (BIST function) 80 is added to the detecting unit.

In a plurality of field effect transistors 181, 182, and 183 for adding the BIST unit 80, the field effect transistors 181, 182, and 183 are n-channel MOS transistors, for example, and the field effect transistor 184 is a p-channel MOS transistor, for example.

A test signal (first test signal) ISOTEST is input to a gate of the MOS transistor 181. One end of a current path of the MOS transistor 181 is connected to the common line COM. The other end of the current path of the MOS transistor 181 is connected to a ground end.

A test signal (second test signal) COMTEST is input to a gate of the MOS transistor 182. One end of a current path of the MOS transistor 182 is connected to a data cache DT_cache through a current path of the MOS transistor 183. The other end of the current path of the MOS transistor 182 is connected to the ground end.

A gate of the MOS transistor 183 is connected to the signal line NCOM. As described above, one end of the current path of the MOS transistor 183 is connected to the data cache DT_cache and the other end of the current path of the MOS transistor 183 is connected to the MOS transistor 182. The MOS transistor 183 is turned on or off according to the potential (signal level) of the signal line NCOM.

The MOS transistor 184 is provided in an inverter 52 of the COM latch circuit 50.

One end of a current path of the MOS transistor 184 is connected to one end (drain) of a current path of a p-channel MOS transistor 121 and the other end of the current path of the MOS transistor 184 is connected to one end (drain) of a current path of an n-channel MOS transistor 122. An output node of the inverter 52 is formed so as to pass through the current path of the MOS transistor 184 and is provided on a connecting point between the MOS transistor 184 and the n-channel MOS transistor 122.

A gate of the MOS transistor 184 is connected to an input node of MOS transistors 111 and 112 in a NOR gate 51. For example, in FIG. 7, the gate of the MOS transistor 184 is connected to a gate of the p-channel MOS transistor 111.

According to this, a signal from the isolation latch circuit 70 is input to the gate of the MOS transistor 184. That is to say, the MOS transistor 184 is turned on or off according to fuse data (for example, failed column flag) held by the isolation latch circuit 70.

In this manner, the detecting unit FU has the self test unit, and according to this, it is possible to detect the failure of the detecting unit. Further, it is possible to inhibit occurrence of erroneous judgment of verification by the failure of the detecting unit FU.

Therefore, according to the second embodiment, it is possible to improve the reliability of the semiconductor memory.

(b) Operation

Operation of the semiconductor memory (for example, flash memory) of the second embodiment is described with reference to FIGS. 8 to 12. Meanwhile, in this embodiment, the operation common to that of the first embodiment is described as needed.

(b-0) Fail Bit Detecting Operation

A detecting operation of a fail bit (verification fail/pass) in the flash memory of this embodiment is described with reference to FIG. 8.

Meanwhile, the operation substantially the same as that of the first embodiment is not described in detail.

When the fuse data held by the isolation latch circuit 70 is at the "L" level, the fuse data at the "L" level is input to the p-channel MOS transistor 184 of the self test unit 80. According to this, the p-channel MOS transistor 184 is turned on.

Then, in order to reset the COM latch circuit 50, the reset signal COMH transitions from the "L" level to the "H" level. The signal line NCOM is set at the "L" level. The signal at the "L" level is inverted to the "H" level by the inverter. Herein, since the p-channel MOS transistor 184 is in an on-state, a power-supply voltage Vdd is applied to the common line COM through the current paths of the two p-channel transistors 184. According to this, the common line COM is set at the "H" level.

Meanwhile, when the fuse data held by the isolation latch circuit 70 is at the "H" level, the p-channel MOS transistor 184 is in an off-state by the fuse data at the "H" level. Since the fuse data at the "H" level indicates that a column block COL is failed, the signal lines COM and NCOM are not charged and discharged, and the COM latch circuit 50 is not reset, but there is no problem.

Further, as illustrated in FIG. 8, the test signals ISOTEST and COMTEST for a self test are maintained at the "L" level during a period of verification judgment.

Thereafter, as with the operation of the verification judgment described with reference to FIG. 5, the potential of the common line COM and the signal line NCOM is changed according to whether the verification passes or the verification fails in the column block COL and the sense unit SU.

According to this, when the verification fail is included, a detecting line LSEN is discharged and when the verification fail is not included, a charged state of the detecting line LSEN is maintained.

In this manner, also when the self test unit 80 is added to the detecting unit FU, it is possible to detect whether the fail bit is present according to presence of the discharge of the detecting line LSEN.

(b-1) Detection of Failure of Isolation Latch Circuit

A method of detecting the failure of the isolation latch circuit 70 and operation thereof by a self test function (for example, BIST function) using the self test unit 80 are described with reference to FIGS. 9 to 12.

<Method of Detecting Failure 1>

A method of detecting the failure 1 of the isolation latch circuit 70 by the BIST function is described with reference to FIGS. 9 and 10. Herein, the method of detecting the failure that the fuse data (for example, failed column flag) held by the isolation latch circuit 70 is fixed at the "L" level and operation of the circuit are described.

Meanwhile, the failure that the signal level (potential) is fixed at the "L" level (or "H" level) includes not only the failure that the level does not change from the "L" level to the "H" level (or from "H" level to "L" level) but also the failure that the signal level unexpectedly returns from the "H" level (or "L" level) to the "L" level (or "H" level).

Figure 9:
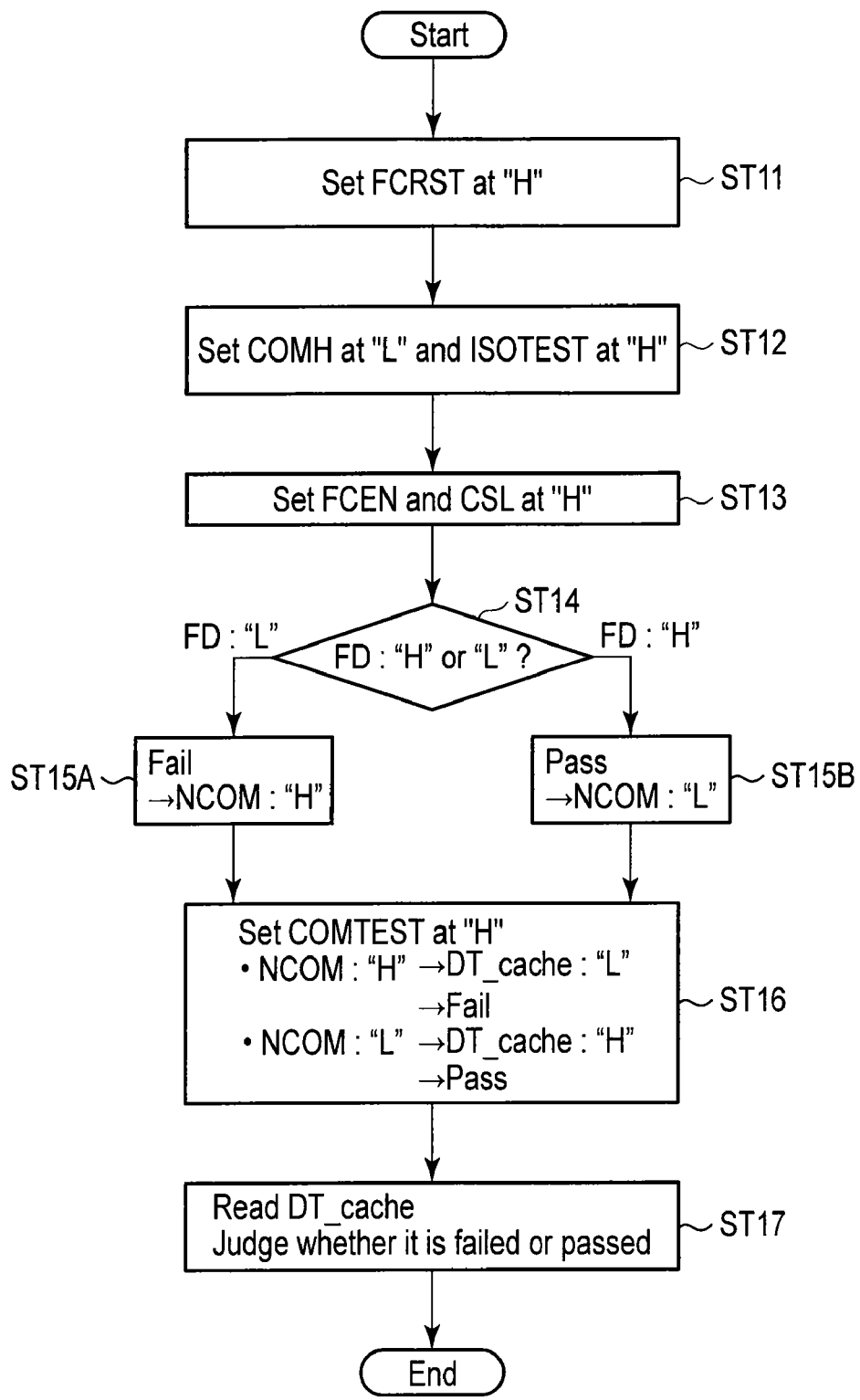
FIG. 9 is a flow chart of the operation example of the semiconductor memory of the second embodiment.

FIG. 9 is a flowchart of the method of detecting the failure 1 of the isolation latch circuit of this embodiment. FIG. 10 is a timing chart in the method of detecting the failure 1 of the isolation latch circuit of this embodiment.

Figure 10:
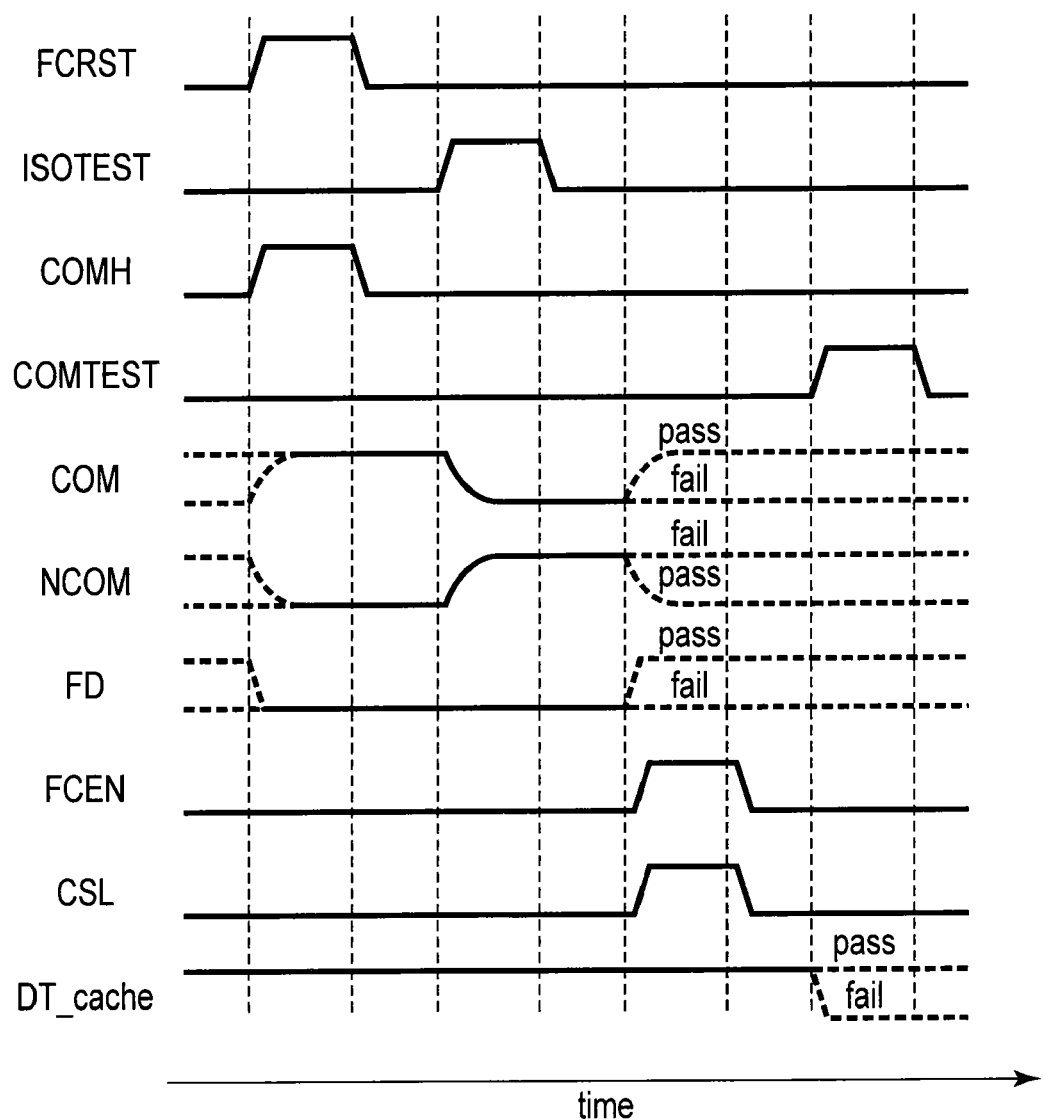
FIG. 10 is a timing chart of the operation example of the semiconductor memory of the second embodiment.

As illustrated in FIGS. 9 and 10, a control signal FCRST for an n-channel MOS transistor 173 in the isolation latch circuit 70 is set at the "H" level. According to this, the MOS transistor 173 is turned on and an input node of an inverter 174 and an output node of an inverter 175 are discharged. Therefore, the potential of the input node of the inverter 174 reaches the "L" level and the fuse data FD held by the isolation latch circuit 70 reaches the "L" level (step ST11).

After the data holding state of the isolation latch circuit 70 is set at the "L" level, the control signal FCRST is set at the "L" level.

Next, the reset signal COMH is set at the "L" level and the test signal ISOTEST is set at the "H" level. Then, the potential of the common line COM reaches the "L" level and the potential of the signal line NCOM reaches the "H" level (step ST12).

Then, in n-channel MOS transistors 171 and 172 in the isolation latch circuit 70, a control signal FCEN is set at the "H" level and a control signal CSL is set at the "H" level (step ST13).

Herein, the signal level of the fuse data differs according to whether the isolation latch circuit 70 includes the failure (step ST14).

When the isolation latch circuit 70 is passed, the potential (signal level) of an output node of the inverter 174 and that of an input node of the inverter 175 reach the "L" level in a flip-flop FF, so that the fuse data FD transitions to the "H" level. In this manner, when the isolation latch circuit 70 is passed, the potential (signal level) of the signal line NCOM transitions from the "H" level to the "L" level (step ST15B).

On the other hand, when there is the failure that the data holding state of the isolation latch circuit 70 is fixed at the "L" level, even when the control signals FCEN and CSL are set at the "H" level, the fuse data FD does not change to the "H" level. In this case, the "H" state of the potential (signal level) of the signal line NCOM is maintained (step ST15A).

Meanwhile, the p-channel MOS transistor 184 as the self test unit 80 in the inverter 52 is turned on/off according to the signal level of the fuse data FD. In association with this, the potential of the common line COM also changes. When the p-channel MOS transistor 184 is in the off-state, a breakthrough current from the signal line NCOM through the inverter 52 toward the common line COM may be reduced. As a result, the flash memory of this embodiment may reduce power consumption at the time of the self test.

The test signal COMTEST is set at the "H" level (step ST16). An initial state of the signal level (potential) of the data cache DT_cache is set at the "H" level.

When the signal line NCOM is at the "H" level, the n-channel MOS transistor 183 as the self test unit 80 is turned on.

The charge held by the data cache DT_cache is discharged to the ground end through the current paths of the MOS transistors 182 and 183, which are in the on-state. According to this, the signal level of the data cache DT_cache transitions from the "H" level to the "L" level.

When the signal line NCOM is at the "L" level, the MOS transistor 183 is turned off. Therefore, the charge of the data cache DT_cache is not discharged and the holding state is maintained. Therefore, the signal level of the data cache DT_cache is maintained at the "H" level.

As described above, when the signal line NCOM is at the "H" level, the isolation latch circuit 70 includes the failure that the fuse data FD is fixed at the "L" level. That is to say, when the signal level of the data cache DT_cache indicates the "L" level, the isolation latch circuit 70 includes the failure that the fuse data FD is fixed at the "L" level.

When the signal line NCOM is at the "L" level, the isolation latch circuit 70 does not include the failure that the fuse data FD is fixed at the "L" level. That is to say, when the signal level of the data cache DT_cache indicates the "H" level, the isolation latch circuit 70 does not include the failure that the fuse data FD is fixed at the "L" level.

Therefore, by reading the data of the data cache DT_cache, it is judged whether the isolation latch circuit 70 includes the failure that the data is fixed at the "L" level (step ST17).

When a read result of the data cache DT_cache is at the "L" level, that is to say, when the isolation latch circuit 70 includes the failure, the column block COL corresponding to the isolation latch circuit 70 is judged to be failed. For example, the failed column block COL is replaced with redundancy for relief of the failure.

As described above, the failure of the isolation latch circuit 70 may be detected by the method of detecting the failure and the operation by the self test function illustrated in FIGS. 9 and 10.

<Method of Detecting Failure 2>

A method of detecting the failure 2 of the isolation latch circuit 70 by the BIST function is described with reference to FIGS. 11 and 12. The method of detecting the failure that the fuse data held by the isolation latch circuit 70 is fixed at the "H" level and the operation are herein described. Meanwhile, the operation substantially the same as that of the above-described method of detecting the failure 1 is described as needed.

Figure 11:
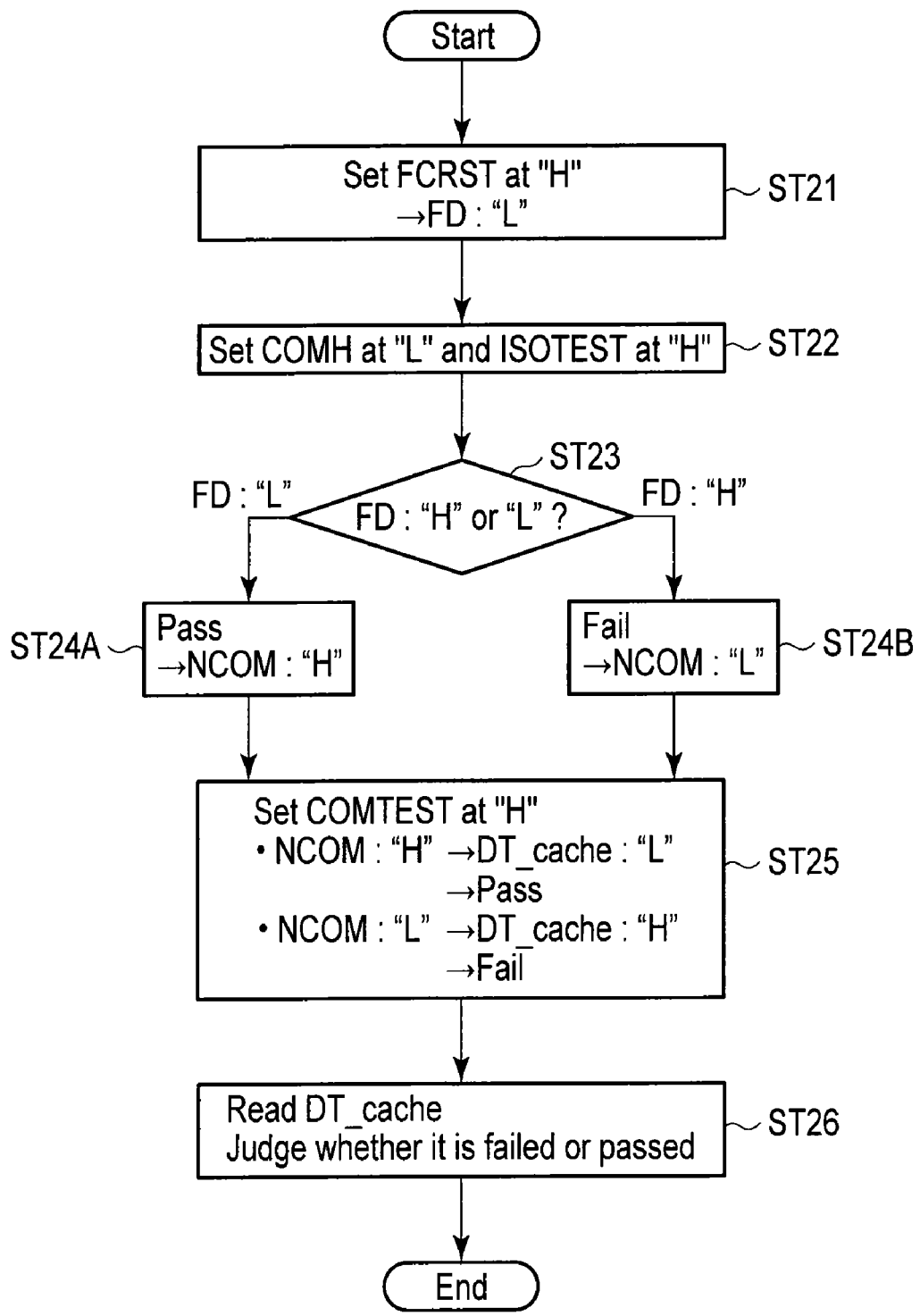
FIG. 11 is a flow chart of the operation example of the semiconductor memory of the second embodiment.

FIG. 11 is a flowchart of the method of detecting the failure 2 of the isolation latch circuit of this embodiment. FIG. 12 is a timing chart in the method of detecting the failure 2 of the isolation latch circuit of this embodiment.

As in the method of detecting the failure 1, the control signal FCRST is set at the "H" level (step ST21). The fuse data FD is set at the "L" level. Meanwhile, when the failure that the data holding state of the isolation latch circuit 70 is fixed at the "H" level is included, even when the control signal FCRST is at the "H" level, the fuse data FD does not reach the "L" level, or the fuse data FD indicates the "L" level only in a period in which the control signal FCRST is at the "H" level.

Further, the reset signal COMH is set at the "H" level, the potential of the signal line NCOM is set at the "L" level, and the potential of the common line COM is set at the "H" level. Then, the test signal ISOTEST is set at the "H" level (step ST22).

When the isolation latch circuit 70 is passed, that is to say, when the fuse data FD is at the "L" level, the potential of the common line COM is at the "L" level and the potential of the signal line NCOM is at the "H" level (step ST24A).

On the other hand, when the failure that the data holding state (fuse data FD) of the isolation latch circuit 70 is fixed at the "H" level is included, the potential of the signal line NCOM is at the "L" level (step ST24B).

The test signal COMTEST is set at the "H" level (step ST25). According to this, the MOS transistor 182 as the self test unit is turned on.

When the isolation latch circuit 70 does not include the failure that the fuse data FD is set at the "H" level, the potential of the signal line NCOM is at the "H" level. In this case, the MOS transistor 183 as the self test unit 80 is turned on. Therefore, when the isolation latch circuit 70 does not include the failure, the potential of the data cache DT_cache indicates the "L" level.

On the other hand, when the isolation latch circuit 70 includes the failure that the fuse data FD is fixed at the "H" level, the potential of the signal line NCOM is at the "L" level. In this case, the MOS transistor 183 is in the off-state. Therefore, when the isolation latch circuit 70 includes the failure, the potential of the data cache DT_cache indicates the "H" level.

By reading the data of the data cache DT_cache, it is judged whether the isolation latch circuit 70 includes the failure that the fuse data FD is fixed at the "H" level (step ST26).

When the isolation latch circuit 70 includes the failure, the failed column block COL is replaced with the redundancy.

As described above, the failure of the isolation latch circuit 70 may be detected by the method of detecting the failure and the operation by the self test function illustrated in FIGS. 11 and 12.

(b-2) Detection of Failure of COM Latch Circuit

A method of detecting the failure of the COM latch circuit and operation by the self test function (for example, BIST function) of the self test unit are described with reference to FIGS. 13 to 16. Meanwhile, the operation substantially the same as the method of detecting the failure and the operation of the above-described isolation latch circuit 70 is described as needed.

<Method of Detecting Failure 1>

A method of detecting the failure 1 of the COM latch circuit 50 by the BIST function is described with reference to FIGS. 13 and 14. The method of detecting the failure that the input on a side of the common line COM in the COM latch circuit 50 is fixed at the "L" level and the operation are herein described. Meanwhile, the failure of the input on the common line COM side in the COM latch circuit 50 includes at least one of the failure of the common line COM and the failure of the COM latch circuit 50 itself.

Figure 13:
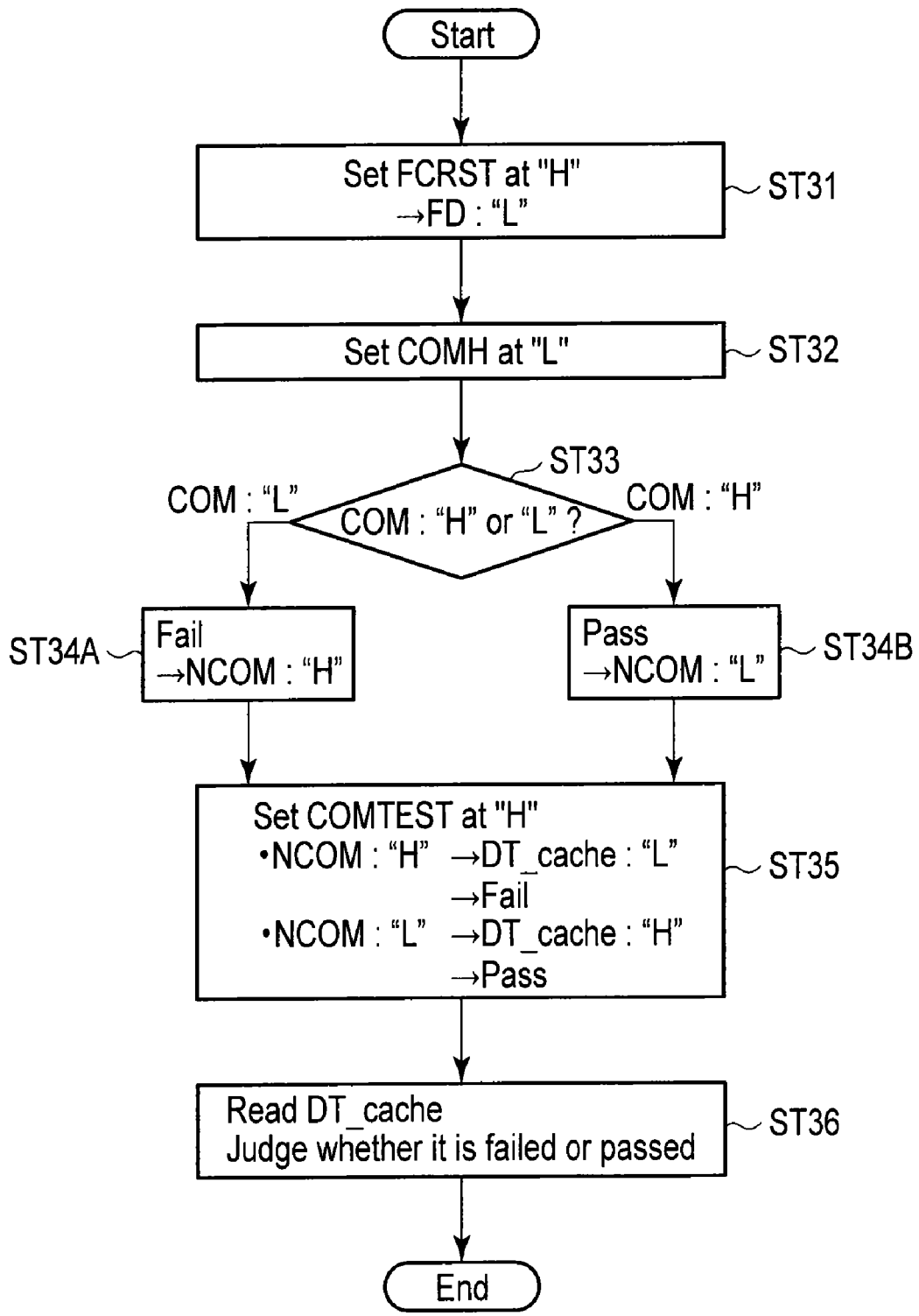
FIG. 13 is a flow chart of the operation example of the semiconductor memory of the second embodiment.

FIG. 13 is a flowchart of the method of detecting the failure 1 of the COM latch circuit of this embodiment. FIG. 14 is a timing chart in the method of detecting the failure 1 of the COM latch circuit of this embodiment.

Figure 14:
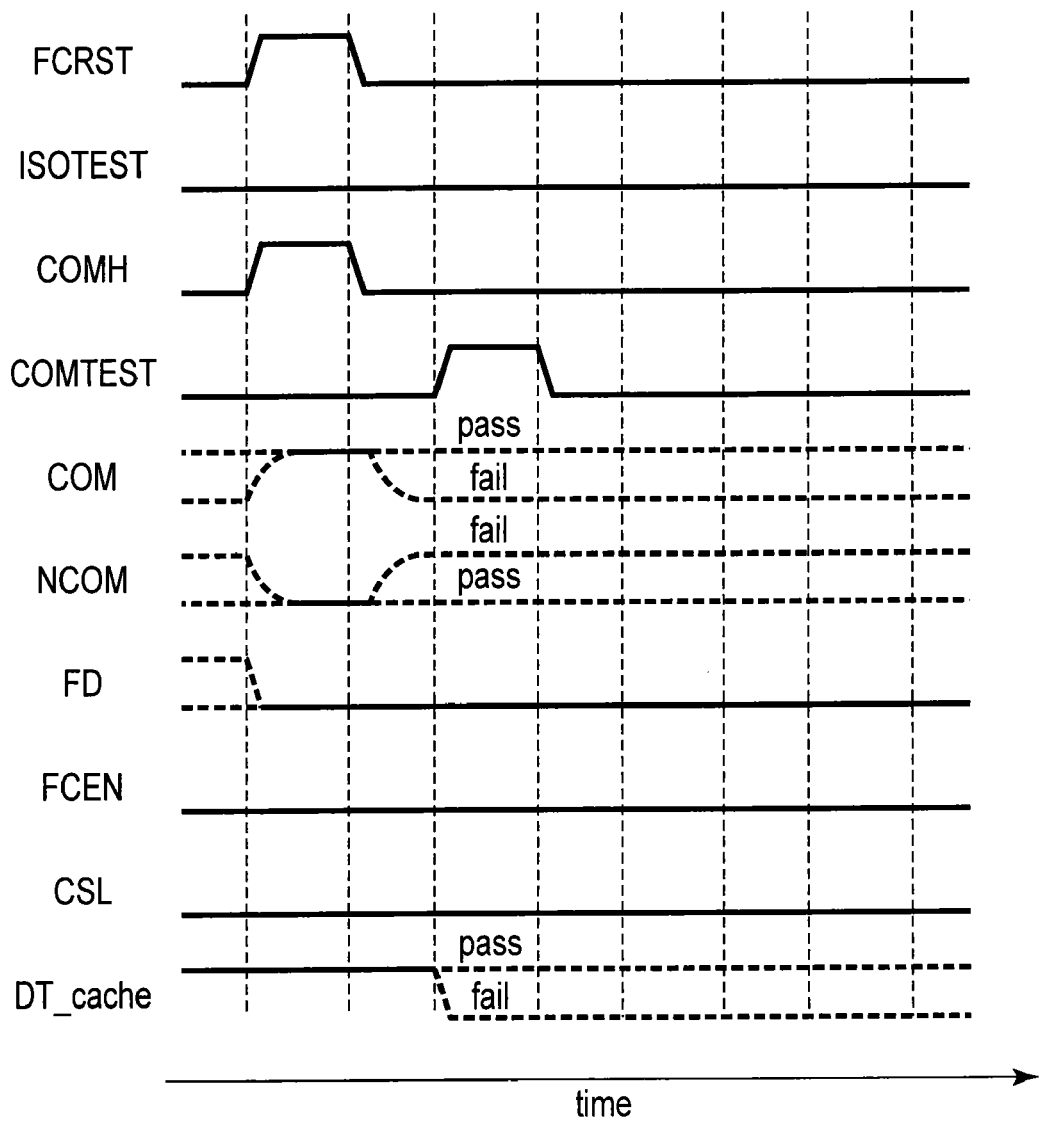
FIG. 14 is a timing chart of the operation example of the semiconductor memory of the second embodiment.

As illustrated in FIGS. 13 and 14, the control signal FCRST is set at the "H" level and the fuse data FD held by the isolation latch circuit 70 is set at the "L" level (step ST31).

The reset signal COMH is once set at the "H" level and the potential of the signal line NCOM is discharged, and thereafter, the reset signal COMH is set at the "L" level (step ST32). Meanwhile, data switching of the isolation latch circuit 70 and the discharge of the signal line NCOM may be performed simultaneously or may be performed at different timings.

Herein, the potential of the common line COM and that of the common line NCOM are different according to whether there is the failure in the common line COM and the input terminal of the COM latch circuit 50 connected to the same.

When the COM latch circuit 50 is passed, the potential of the signal line COM reaches the "H" level and the potential of the signal line NCOM reaches the "L" level by the discharge of the signal line NCOM (step ST34B).

On the other hand, when there is the failure that the input terminal of the COM latch circuit 50 is fixed at the "L" level, the potential of the common line COM reaches the "L" level and the potential of the signal line NCOM reaches the "H" level (step ST34A).

Thereafter, the test signal COMTEST is set at the "H" level (step ST35). According to this, the re-channel MOS transistor 182 as the self test unit 80 is turned on.

Further, according to the potential of the signal line NCOM, the n-channel MOS transistor 181 as the self test unit 80 is turned on or off.

When the potential of the signal line NCOM is at the "L" level, the MOS transistor 181 is turned off. Therefore, the potential of the data cache DT_cache indicates the "H" level.

On the other hand, when the potential of the signal line NCOM is at the "H" level, the MOS transistor 181 is turned on. According to this, the charge of the data cache DT_cache is discharged through the two MOS transistors 182 and 183, which are in the on-state. As a result, the potential of the data cache DT_cache indicates the "L" level.

In this manner, in the above-described operation, when the data cache is at the "H" level, the failure that the input on the common line COM side in the COM latch circuit 50 is fixed at the "L" level is not included. On the other hand, when the data cache is at the "L" level, the failure that the input on the common line COM side in the COM latch circuit 50 is fixed at the "L" level is included.

Then, the control unit 10 reads the data of the data cache DT_cache, and according to this, it is judged whether the failure that the input on the common line COM side in the COM latch circuit 50 is fixed at the "L" level is included (step ST35).

When the read result of the data cache DT_cache is at the "L" level, that is to say, when the input on the common line COM side in the COM latch circuit 50 includes the failure, the column block COL corresponding to the COM latch circuit 50 is judged to be failed. For example, the failed column block COL is replaced with the redundancy for the relief of the failure.

As described above, the failure of the COM latch circuit 50 may be detected by the method of detecting the failure and the operation by the self test function illustrated in FIGS. 13 and 14.

<Method of Detecting Failure 2>

A method of detecting the failure 2 of the COM latch circuit 50 by the BIST function is described with reference to FIGS. 15 and 16. The method of detecting the failure that the input on the common line COM side in the COM latch circuit 50 is fixed at the "H" level and the operation are herein described.

FIG. 15 is a flowchart of the method of detecting the failure 2 of the COM latch circuit of this embodiment. FIG. 16 is a timing chart in the method of detecting the failure 2 in the COM latch circuit of this embodiment.

Figure 16:
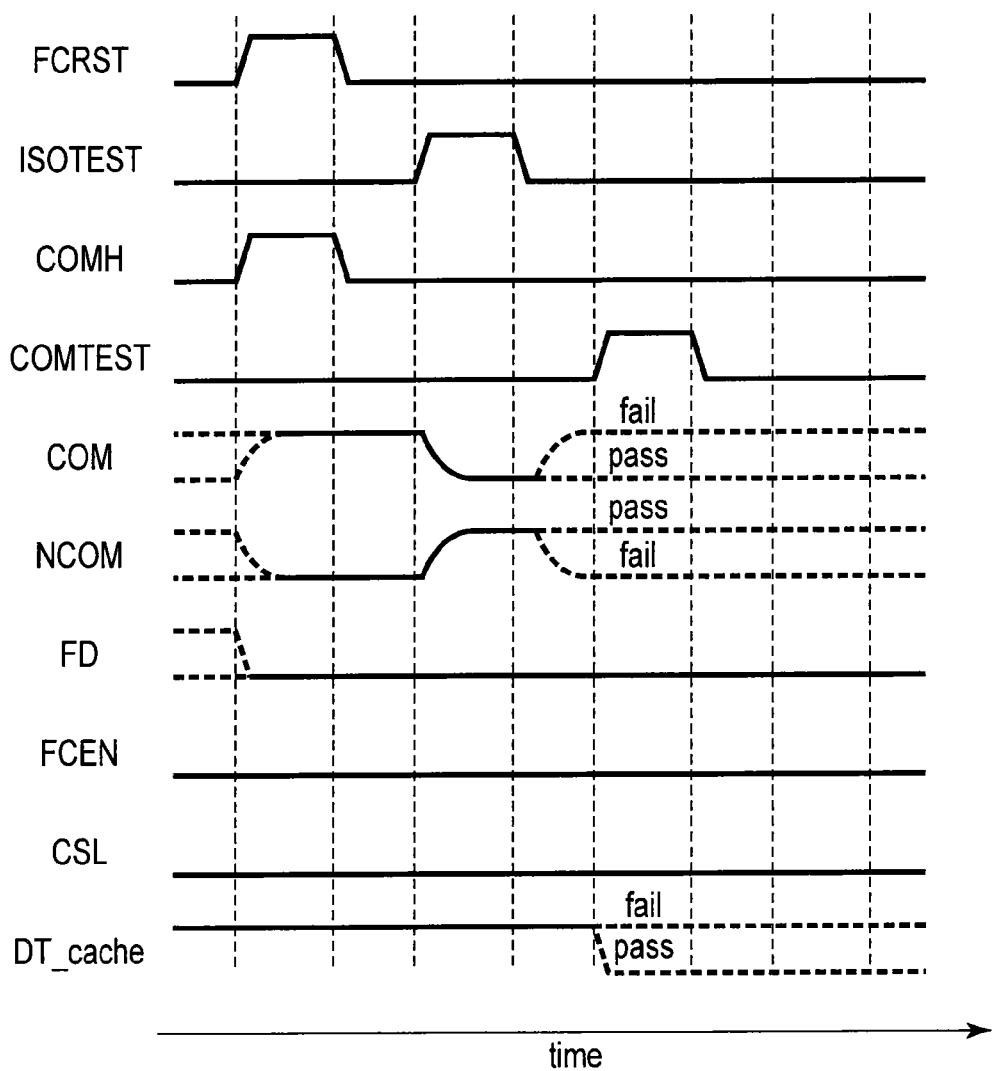
FIG. 16 is a timing chart of the operation example of the semiconductor memory of the second embodiment.

As illustrated in FIGS. 15 and 16, the control signal FCRST is set at the "H" and the fuse data FD is set at the "L" level (step ST41).

The reset signal COMH is changed from the "L" level to the "H" level. The potential of the signal line NCOM reaches the "L" level and the potential of the common line COM reaches the "H" level (step ST42).

Further, the test signal ISOTEST is set at the "H" level. When the common line COM and the input terminal of the COM latch circuit 50 are passed, the common line COM is put into the discharged state and the potential and the signal level of the common line COM reach the "L" level.

The signal level of the signal line NCOM differs according to whether the failure that the input on the common line COM side of the COM latch circuit 50 is fixed at the "H" level is included (step ST43).

When the failure that the input on the common line COM side of the COM latch circuit 50 is fixed at the "H" level is included, the potential of the signal line NCOM indicates the "L" level (step ST44B).

When the failure that the input on the common line COM side of the COM latch circuit 50 is fixed at the "H" level is not included, the potential of the common line COM changes to the "L" level by the discharge, so that the potential of the signal line NCOM indicates the "H" level (step ST44A).

Then, the test signal COMTEST is set at the "H" level (step ST45). When the potential of the signal line NCOM is at the "H" level, the data cache DT_cache is discharged to indicate the "L" level. When the potential of the signal line NCOM is at the "L" level, the charged state of the data cache DT_cache is maintained to indicate the "H" level.

In this manner, in the above-described operation, when the data cache DT_cache is at the "L" level, the failure that the input on the common line COM side in the COM latch circuit 50 is fixed at the "H" level is not included. On the other hand, when the data cache DT_cache is at the "H" level, the failure that the input on the common line COM side in the COM latch circuit 50 is fixed at the "H" level is included.

Then, by reading the data of the data cache DT_cache, it is judged whether the failure that the input on the common line COM side in the COM latch circuit 50 is fixed at the "H" level is included (step ST46).

When the read result of the data cache DT_cache is at the "H" level, that is to say, when the input on the common line COM side in the COM latch circuit 50 includes the failure, the column block COL corresponding to the COM latch circuit 50 is judged to be failed. For example, the failed column block COL is replaced with the redundancy for the relief of the failure.

As described above, the failure of the COM latch circuit 50 may be detected by the method of detecting the failure and the operation by the self test function illustrated in FIGS. 15 and 16.

(c) Summary

The semiconductor memory (for example, flash memory) of the second embodiment includes the self test unit 80 (for example, BIST unit) in the fail bit detecting circuit 5 in addition to the configuration of the first embodiment. The self test unit 80 detects the failure in the fail bit detecting circuit 5, for example, the failure of the detecting unit FU.

As described above, miniaturization of the device is advanced so as to improve the storage density and reduce a chip cost. In association with the miniaturization, an interconnect width and pitch between adjacent interconnects are also decreased. Due to this, the possibility of occurrence of a disconnection of the interconnect and a short circuit of the interconnects increases.

As the flash memory of this embodiment, by adding the self test function of the self test unit 80, it is possible to detect the failure of the detecting unit FU in the fail bit detecting circuit 5 and the failure of the column.

According to this, the flash memory of this embodiment may reduce an unnecessary repeat of data writing or data erasing due to the failure in the fail bit detecting circuit 5 and the failure of the column.

It is possible to reduce the failure that a verification result is judged in error by the failure in the fail bit detecting circuit 5. As a result, deterioration of the reliability of the flash memory is inhibited.

Further, by the self test of the memory, the time required for the test may be reduced as compared to the test using a test device and a manufacturing cost of the memory may be reduced. Further, by detecting the failed column, it is possible to relieve the failed column by the redundancy and inhibit deterioration in manufacturing yield.

As described above, the semiconductor memory of the second embodiment may obtain an effect similar to that of the first embodiment and improve the reliability of the memory by the self test, so that the time required for the test and the cost may be reduced.

Therefore, according to the second embodiment, the reliability of the memory may be improved.

(3) Third Embodiment

A semiconductor memory of a third embodiment is described with reference to FIGS. 17 to 20. An entire configuration of the semiconductor memory of the third embodiment is similar to that of the first embodiment, so that differences between the embodiments are herein mainly described. In the third embodiment, common reference numerals are assigned to configurations substantially the same as configurations described in the first and second embodiments and configurations and functions thereof are described as needed.

(a) Circuit Configuration

A circuit configuration of the semiconductor memory (for example, flash memory) of the third embodiment is described with reference to FIGS. 17 to 19.

FIG. 17 is a block diagram schematically illustrating the configuration of the flash memory of this embodiment.

The flash memory of this embodiment further includes a fail bit count circuit (count circuit) 90 in addition to the configuration of the first or second embodiment.

The fail bit count circuit 90 is connected in common to a plurality of column blocks COL and a plurality of sense units SU in a sense amplifier circuit 4 through detecting units FU in a fail bit detecting circuit 5. The fail bit count circuit 90 is connected to a plurality of detecting units FU through a common detecting line LSEN.

An internal configuration of the fail bit count circuit 90 is described with reference to FIG. 18. Meanwhile, although the fail bit count circuit 90 is connected to a plurality of detecting units FU through the detecting line LSEN as described above (for example, FIG. 17), only one detecting unit FU is illustrated in FIG. 18 to simplify an illustration.

Figure 18:
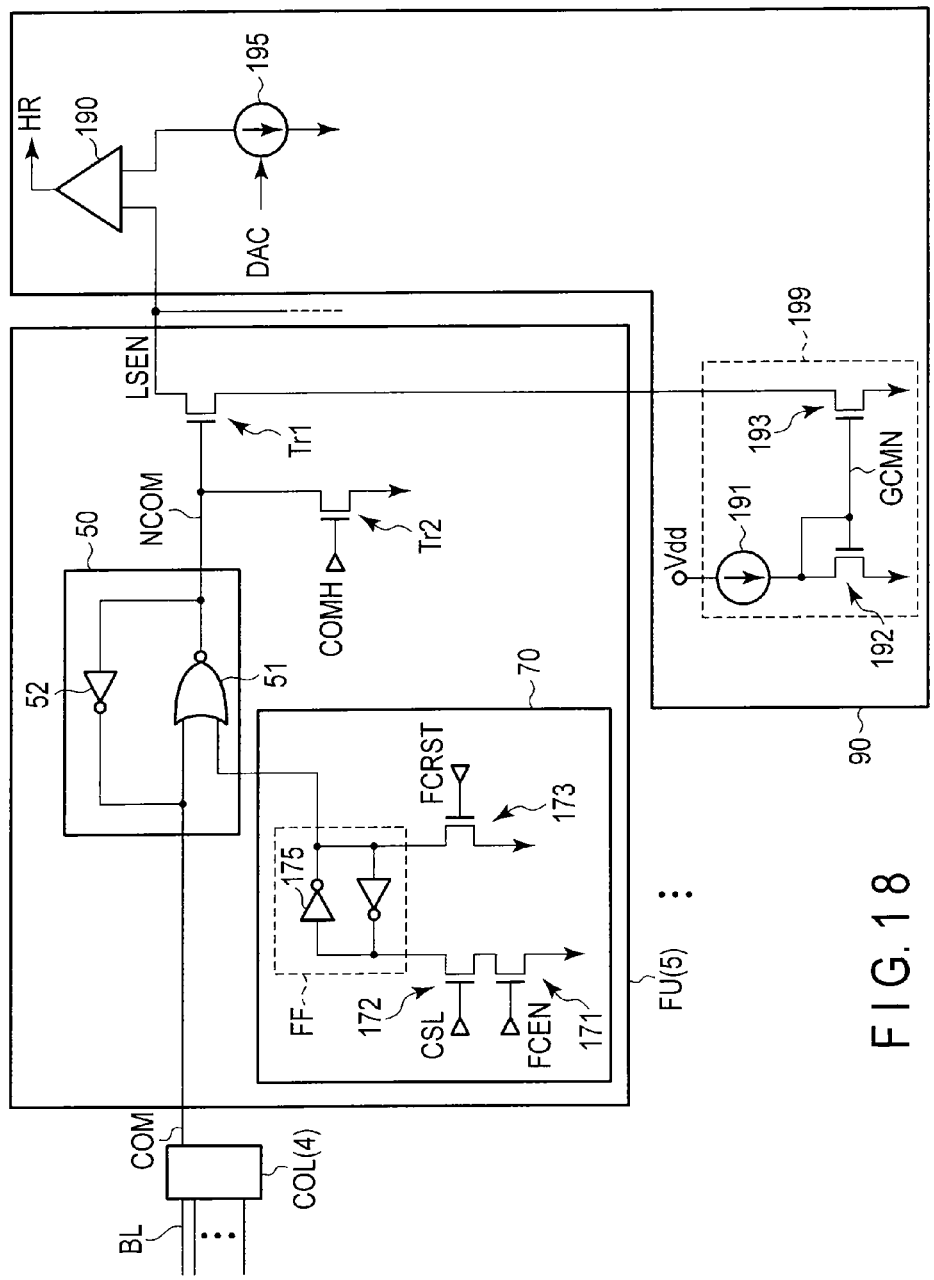
FIG. 18 is an equivalent circuit diagram of a circuit configuration example of the semiconductor memory of the third embodiment.

As illustrated in FIG. 18, the fail bit count circuit 90 includes an operation amplifier 190 and a current source 195. The fail bit count circuit 90 includes a current mirror circuit 199. The current mirror circuit 199 is connected in common to a plurality of detecting units FU.

The current mirror circuit 199 is connected to the other end of a current path of a MOS transistor Tr1 in the detecting unit FU.

The current mirror circuit 199 includes one current source 191 and two field effect transistors, 192 and 193. The field effect transistors 192 and 193 are n-channel MOS transistors, for example. One MOS transistor 192 is diode-connected.

One end of the current source 191 is connected to a current path of the diode-connected MOS transistor 192 and a signal line GCMN. The other end of the current source 191 is connected to a power supply Vdd. The current source 191 outputs a current IREF to the current path of the diode-connected MOS transistor 192 and the signal line GCMN.

The current source 191 is connected to a gate and one end of the current path of the diode-connected MOS transistor 192. The gate and one end of the current path of the MOS transistor 192 are connected to the signal line GCMN. The other end of the current path of the MOS transistor 192 is connected to a ground end.

A gate of the MOS transistor 193 is connected to the signal line GCMN. One end of a current path of the MOS transistor 193 is connected to the other end of the current path of the MOS transistor Tr1. The other end of the current path of the MOS transistor 193 is connected to the ground end.

A voltage corresponding to the current value IREF flowing through the signal line GCMN is applied to the gate of the MOS transistor 193. The current mirror circuit 199 is formed as described above. Therefore, when the current driving force of the MOS transistor 193 is comparable to the current driving force of the diode-connected MOS transistor 192, the current the magnitude of which is substantially the same as that of the current (for example, current IREF) flowing through the current path of the MOS transistor 192 flows through the current path of the MOS transistor 193.

One end of the current path of the MOS transistor 193 of the current mirror circuit 199 is connected to the current path of the MOS transistor Tr1. Therefore, the current mirror circuit 199 is connected to one input terminal of the operation amplifier 190 of the fail bit count circuit 90 through the MOS transistor Tr1 and the detecting line LSEN. According to this, when the MOS transistor Tr1 is turned on, an output current of the current mirror circuit 199 and potential corresponding to this are supplied to the operation amplifier 190.

For example, when m MOS transistors Tr1 out of the MOS transistors Tr1 of all the column blocks COL are turned on, that is to say, when the verification fails in the m memory cell transistors, the current the magnitude of which is "m×IREF" flows through the detecting line LSEN and the potential of the detecting line LSEN varies according to the current value.

Meanwhile, it is also possible that one current mirror circuit 199 is connected in common to a plurality of detecting units FU according to the configuration of the fail bit count circuit 90. Further, the configuration of the current mirror circuit 199 is not limited to the configuration illustrated in FIG. 18.

In the fail bit count circuit 90, one input terminal of the operation amplifier 190 is connected to one end of the current path of the MOS transistor Tr1 in the detecting unit FU through the detecting line LSEN. The other input terminal of the operation amplifier 190 is connected to the current source 195.

The current source 195 outputs a reference current IREF×(n+0.5) (n≧0). Hereinafter, the current source 195 is referred to as a reference current source 195.

The reference current source 195 is capable of switching the magnitude of the output current by a control signal DAC. The magnitude of the output current of the reference current source 195 is controlled so as not to be smaller than 0.5×IREF and not to be larger than IREF×(n+0.5) by the control signal DAC. A value of "n" in the reference current IREF×(n+0.5) is changed by the control signal DAC.

The operation amplifier 190 compares the potential of the detecting line LSEN resulting from the output current IREF×m of the current mirror circuit 199 with the potential resulting from the reference current IREF×(n+0.5) (n≧0). The operation amplifier 190 outputs a comparison result as a signal HR.

Figure 19:
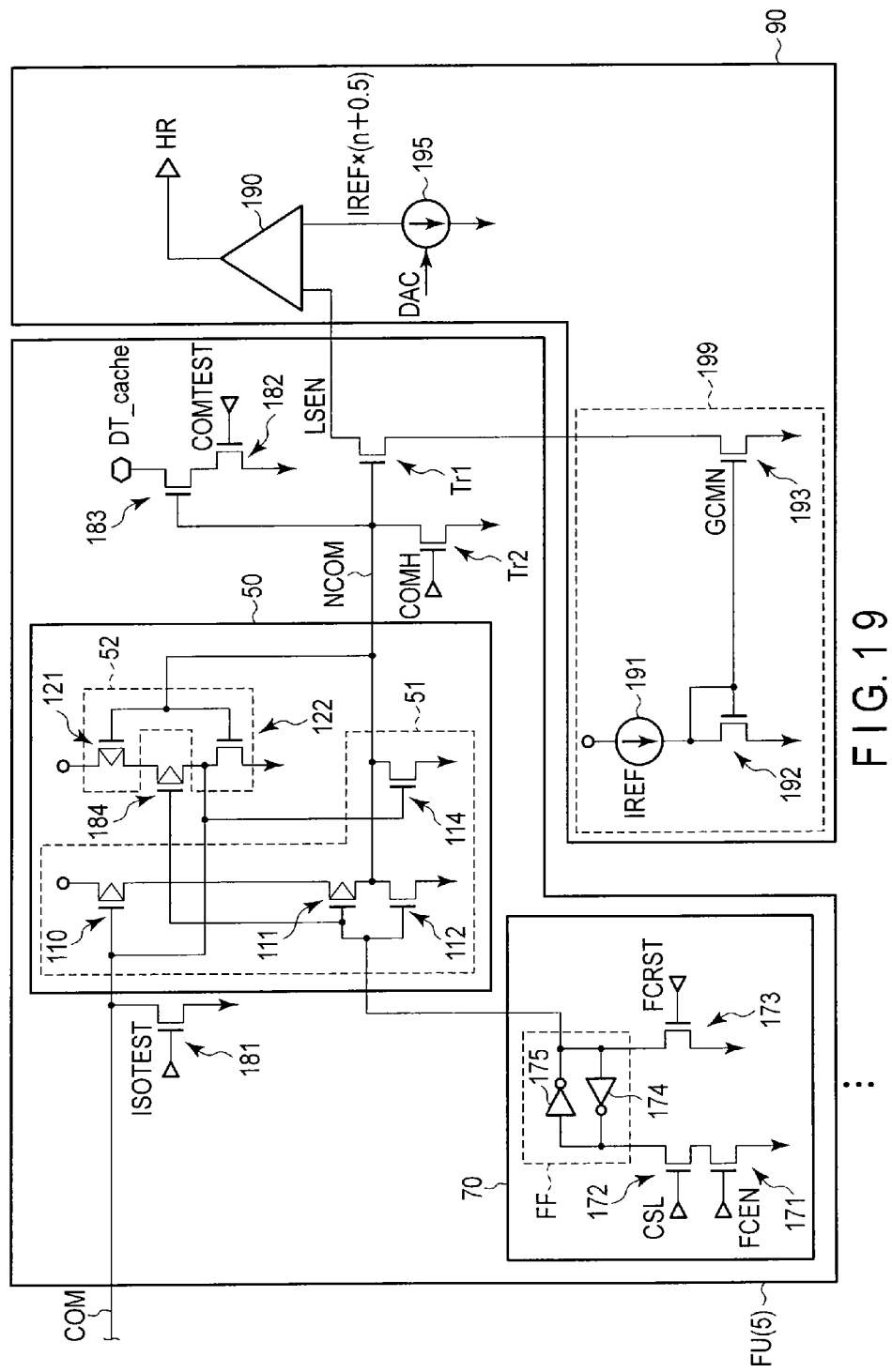
FIG. 19 is an equivalent circuit diagram of the circuit configuration example of the semiconductor memory of the third embodiment.

Meanwhile, as illustrated in FIG. 19, also when the detecting unit FU includes the self test unit (for example, BIST unit), the current mirror circuit 199 and the fail bit count circuit 90 may be provided.

Meanwhile, in this embodiment, the configurations of the current mirror circuit 199 and the fail bit count circuit 90 illustrated in FIGS. 18 and 19 are only one example and there is no limitation.

In this manner, by providing the current mirror circuit 199 and the fail bit count circuit 90 in the flash memory, it is possible to count the number of fail bits in data writing. According to this, it is possible to execute an operation sequence in consideration of an allowable value of error correction by error checking and correcting (ECC).

Therefore, according to the third embodiment, the reliability of the semiconductor memory may be improved.

(b) Operation

Hereinafter, operation of the semiconductor memory (for example, flash memory) of the third embodiment is described with reference to FIG. 20. Meanwhile, it is herein described appropriately with reference to FIG. 3.

Herein, the operation to count the number of fail bits at the time of write operation and erase operation (hereinafter, referred to as fail bit counting operation) is described. According to the fail bit counting operation of the flash memory of this embodiment, in addition to detecting presence of the fail bit in the flash memory of the first embodiment, the number of fail bits may be counted.

Meanwhile, in this embodiment, the operation similar to that of the first embodiment is described as needed. Further, in this embodiment, since a self testing operation of the flash memory illustrated in FIG. 19 is substantially similar to that of the second embodiment, the description thereof is not repeated.

FIG. 20 is a timing chart of the fail bit counting operation in the flash memory of this embodiment.

As illustrated in FIG. 20, a reset signal COMH is set at an "H" level and the potential of a signal line NCOM is set at an "L" level. In association with this, the potential of a common line COM is changed to the "H" level in each column block COL.

In all the column blocks COL set for a memory cell array 1, a control signal CHK0 corresponding to one sense amplifier SU0 is set at the "H" level, for example. According to this, a MOS transistor $41_0$ to which the control signal CHK0 is input is turned on in each column unit COL.

Herein, in each column block, when a sense amplifier $40_0$ corresponding to the control signal CHK0 holds the data indicating verification fail ("H" level), a MOS transistor $42_0$ the gate of which is connected to the sense amplifier $40_0$ is turned on.

Therefore, the common line COM is discharged through current paths of the two MOS transistors $41_0$ and $42_0$ (check circuit) in the sense unit SU0.

In the column block COL in which the selected sense unit SU0 includes the verification fail, the potential of the common line COM changes to the "L" level and the potential of the signal line NCOM changes to the "H" level.

When the sense amplifier $40_0$ holds the data indicating the verification pass ("L" level), the MOS transistor $42_0$ the gate of which is connected to the sense amplifier $40_0$ is not turned on. Therefore, a charged state of the common line COM is maintained.

In the column block COL in which the selected sense unit SU0 does not include the verification fail, the potential of the common line COM is maintained at the "H" level and the potential of the signal line NCOM is also maintained at the "L" level.

When an isolation latch circuit 70 holds fuse data at the "L" level, an output of a NOR gate 51 is at the "H" level and the potential of the signal line NCOM is at the "H" level. Meanwhile, when the isolation latch circuit 70 holds the fuse data at the "H" level, the column block COL corresponding to the same is failed. In this case, the output of the NOR gate 51 reaches the "L" level regardless of the potential of the common line COM, so that the signal line NCOM is maintained at the "L" level regardless of whether the common line COM is at the "L" level or the "H" level.

When the potential of the signal line NCOM changes to the "H" level, the MOS transistor Tr1 connected to the detecting line LSEN is turned on.

Further, in this embodiment, the current mirror circuit 199 of each column block is driven. That is to say, a voltage generated by the current IREF is applied to the signal line GCMN and the current mirror circuit 199 outputs the current IREF.

The output current IREF of the current mirror circuit 199 flows to the detecting line LSEN through the MOS transistor, which is in an on-state.

On the other hand, when the MOS transistor Tr1 is in an off-state, the output current from the current mirror circuit 199 in the column block COL is not supplied to the detecting line LSEN.

In this manner, the output current from the column block including the sense unit SU0, which holds data of the verification fail, is supplied to the detecting line LSEN.

The detecting line LSEN is connected in common to a plurality of column blocks COL. Therefore, the magnitude of the current supplied to the detecting line LSEN becomes the magnitude corresponding to the number of verification fails. That is to say, when the number of verification fails is m in the sense units SU0 of the all column blocks COL, the magnitude of the current, which flows through the detecting line LSEN, is "m×IREF".

According to the magnitude of the current from the current mirror circuit 199, the potential of the detecting line LSEN varies and the potential of the detecting line LSEN becomes smaller than the reference potential (for example, "H" level), for example.

Meanwhile, when the sense unit SU0 being a detection target holds the data of verification pass in all the column blocks COL, the output current of the current mirror circuit is not supplied to the detecting line LSEN, so that the potential of the detecting line LSEN does not vary.

The potential of the detecting line LSEN, which varies according to the number of verification fails m, is applied to one input terminal of the operation amplifier 190.

The potential generated by the output current IREF×(n+0.5) of the reference current source 195 is applied to the other input terminal of the operation amplifier 190.

The reference current IREF×(n+0.5) of the reference current source 195 gradually increases at a predetermined timing (for example, operation clock) by the control signal DAC for the reference current source 195.

In a case in which a relationship n<m is satisfied, the potential resulting from the reference current IREF×(n+0.5) is smaller than the potential resulting from the current IREF× m. In this case, the output signal HR of the operation amplifier 190 is maintained at the "L" level.

When the value of "n" is increased by the control signal DAC to satisfy the relationship n=m, the potential resulting from the reference current IREF×(n+0.5) becomes larger than the potential resulting from the current IREF×m and the output signal HR of the operation amplifier 190 is inverted from the "L" level to the "H" level, for example.

A control unit 10 detects that the output signal HR of the operation amplifier 190 is inverted, and the control unit 10 captures the value "n" of the control signal DAC when the output signal HR is inverted in a cache in the control unit 10.

The control unit 10 calculates the number m of the fail bits based on the value n of the control signal DAC. According to this, the number of sense units SU0, which hold the data of the verification fail, that is to say, the number of memory cell transistors MT to which the writing is not completed is counted in all column blocks COL.

By repeating a similar operation for all the column blocks from a sense unit SU1 to a sense unit SU7 of the column block COL, the number of all the fail bits in the data writing or the data erasing is counted.

In this manner, by reflecting the verification results of the sense units SU one by one in the common line COM in the column block COL, the number of verification fails included in the column block COL is counted by the fail bit count circuit 90.

For example, the control unit 10 finishes the write operation (or erase operation) when the number of fail bits is not larger than the allowable value relievable by the ECC and writes the data again when the number of fail bits is larger than the allowable value.

As described above, according to the flash memory of this embodiment, it is possible to count the number of fail bits in the operation sequence by further providing the fail bit count circuit 90.

(c) Summary

The semiconductor memory (flash memory, for example) of the third embodiment further includes the fail bit count circuit (count circuit) 90 in addition to the configuration of the first or second embodiment.

By the fail bit count circuit 90, the number of verification fails generated at the time of the writing or the erasing, that is to say, the number of memory cell transistors in which a writing failure or an erasing failure occurs (number of bits) may be detected.

For example, when the number of detected verification fails is within an allowable range of the error correction by the ECC, the correction of the data may be executed by the ECC when outputting the data even when a page PG or the memory cell transistor includes the writing failure. That is to say, it is not required to execute the data writing/erasing until the verification passes in all the memory cell transistors MT being a writing target.

As a result, an increase in power consumption resulting from a repeat of the data writing and deterioration in an operation speed of the flash memory may be inhibited.

Further, since the number of verification fails may be detected, management of the memory cell array such as replacement with redundancy may be made efficient.

Therefore, the semiconductor memory of the third embodiment may improve the reliability of the memory as in the first and second embodiments.

(4) Fourth Embodiment

A semiconductor memory of a fourth embodiment is described with reference to FIGS. 21 to 23. Differences between the fourth embodiment and other embodiments are herein mainly described. In the fourth embodiment, common reference numerals are assigned to configurations substantially the same as configurations described in the first to third embodiments and configurations and functions thereof are described as needed.

(a) Circuit Configuration

A circuit configuration of the semiconductor memory (for example, flash memory) of the fourth embodiment is described with reference to FIGS. 21 to 23.

FIG. 21 is a block diagram schematically illustrating an internal configuration of a detecting unit FU in the flash memory of this embodiment. FIG. 22 is an equivalent circuit diagram illustrating the internal configuration of the detecting unit FU more specifically.

Although a latch circuit formed of a NOR gate and an inverter is used as a cache for a common line COM in the first to third embodiments, the internal configuration of the latch circuit is not limited thereto.

For example, a COM latch circuit 50A including a NAND gate 55 may be connected to the common line COM as illustrated in FIG. 21.

As illustrated in FIG. 21, a field effect transistor Tr2A is connected to the common line COM. For example, the field effect transistor Tr2A is a p-channel MOS transistor Tr2A. One end of a current path of the MOS transistor Tr2A is connected to the common line COM and the other end of the current path of the MOS transistor Tr2A is connected to a power supply Vdd. A control signal COMHn is input to a gate of the MOS transistor Tr2A and the MOS transistor Tr2A is controlled to be turned on and off by the control signal COMHn. The MOS transistor Tr2A is turned on by the control signal COMHn, and according to this, a power-supply voltage Vdd is applied to the common line COM and the common line COM is charged to an "H" level.

In this embodiment, the COM latch circuit 50A in the detecting unit FU includes the NAND gate 55 and an inverter 56.

In the COM latch circuit 50A, an output terminal of the NAND gate 55 is connected to the common line COM. The control signal COMHn is input to one input terminal of the NAND gate 55. One input terminal of the NAND gate 55 is connected to the gate of the MOS transistor Tr2A, for example. The other input terminal of the NAND gate 55 is connected to a signal line NCOM.

Further, in the COM latch circuit 50A, an input node of the inverter 56 is connected to the common line COM and an output node of the inverter 56 is connected to the signal line NCOM. The inverter 56 connects the output terminal of the NAND gate 55 and the other input terminal of the NAND gate 55.

In an example illustrated in FIG. 22, the NAND gate 55 is formed of four field effect transistors (for example, MOS transistors) 130, 131, 132, and 134, for example.

When the control signal COMHn is at the "H" level, the NAND gate 55 substantially serves as a CMOS inverter 103 formed of a p-channel MOS transistor 131 and an n-channel MOS transistor 132.

Gates of the two MOS transistors 131 and 132 are connected to each other to form an input node. The input node of the MOS transistors 131 and 132 (inverter 103) is connected to the signal line NCOM. The input node of the MOS transistors 131 and 132 corresponds to the other input terminal of the NAND gate 55.

Drains of the MOS transistors 131 and 132 are connected to each other to form an output node. A source of the MOS transistor 131 is connected to the power supply Vdd and a source of the MOS transistor 132 is connected to one end of a current path of the MOS transistor 130.

Current driving force of the p-channel MOS transistor 131 is smaller than the current driving force of n-channel MOS transistors 41 and 42 of a sense unit SU, for example. According to this, as in the above-described embodiments, the potential (signal level) of the common line COM is forcedly inverted from the "H" level to an "L" level.

The MOS transistor 130 is the n-channel MOS transistor, for example.

The other end of the current path of the MOS transistor 130 is connected to a ground end. The control signal COMHn is input to a gate of the MOS transistor 130 and the MOS transistor 130 is controlled to be turned on/off by the control signal COMHn. The gate of the MOS transistor 130 is connected to the gate of the MOS transistor Tr2A, for example.

The field effect transistor 134 is the p-channel MOS transistor.

One end of a current path of the MOS transistor 134 is connected to the power supply Vdd and the other end of the current path of the MOS transistor 134 is connected to the output node of the MOS transistors 131 and 132 of the NAND gate 55. The control signal COMHn is input to a gate of the MOS transistor 134 and the MOS transistor 134 is controlled to be turned on/off by the control signal COMHn. For example, the MOS transistor 134 is the p-channel MOS transistor.

The gate of the MOS transistor 134 is used as the other input terminal of the NAND gate 55 together with the gate of the MOS transistor 130.

The input node of the inverter 56 is connected to the common line COM through a signal line COMi. The output node of the inverter 56 is connected to the signal NCOM and the other input terminal of the NAND gate 55 (input node of MOS transistors 131 and 132). An output signal of the inverter 56 is input to the other input terminal of the NAND gate 55 through the signal line NCOM.

The input node of the inverter 56 and the output node of the MOS transistors 131 and 132 are connected to the common line COM through current paths of two field effect transistors 151 and 152.

The field effect transistors 151 and 152 are the n-channel MOS transistors.

One end of the current path of the MOS transistor 151 is connected to the common line COM and the other end of the current path of the MOS transistor 151 is connected to one end of the current path of the MOS transistor 152. A control signal SEG is input to a gate of the MOS transistor 151.

The control signal SEG is the signal for selecting a range of a target (block BLK or column block COL) of operation of the memory, verify judgment, or detection of the fail bit. Therefore, when the column block COL is the target of the operation, the MOS transistor 151 is turned on by the control signal SEG and the column block thereof is selected.

One end of the current path of the MOS transistor 152 is connected to the signal line COM through the current path of the MOS transistor 151. The other end of the current path of the MOS transistor 152 is connected to the inverter 56 by the signal line COMi. Further, the other end of the current path of the MOS transistor 152 is connected to the output node of the MOS transistors 131 and 132 (output terminal of the NAND gate 55) and the other end of the current path of the MOS transistor 134.

A gate of the MOS transistor 152 is connected to an output terminal of an isolation latch circuit 70. Meanwhile, in this embodiment, the output terminal of the isolation latch circuit 70 is formed of an input node of an inverter 175 and an output node of an inverter 174, which form a flip-flop FF.

The MOS transistor 152 is controlled to be turned on/off according to a signal level of an output signal (fuse data) of the isolation latch circuit 70.

In this embodiment, when the latch circuit 70 holds the fuse data at the "L" level, the column block COL corresponding to the same is judged to be failed and is isolated from the operation target to be electrically separated. When the latch circuit 70 holds the fuse data at the "H" level, the column block COL corresponding to the same is judged to be passed and is used as the operation target.

Therefore, when the fuse data at the "L" level is held by the isolation latch circuit 70, the n-channel MOS transistor 152 is turned off. According to this, there is no input and output of the signal (potential) between the common line COM and the signal line COMi.

On the other hand, when the fuse data at the "H" level is held by the isolation latch circuit 70, the re-channel MOS transistor 152 is turned on. By the MOS transistor 151 turning on, the common line COM and the signal line COMi are electrically connected to each other and the signal (potential) of the common line COM is input to the input node of the inverter 56.

In this embodiment, when the fuse data held by the isolation latch circuit 70 is at the "H" level, the signal of the common line COM is input to one input terminal of the NAND gate 55 (input node of MOS transistors 131 and 132) through the MOS transistors 151 and 152 and the inverter 56. Further, the control signal COMHn is input to the other input terminal of the NAND gate 55 (gates of MOS transistors 130 and 134).

The NAND gate 55 performs operation processing (NAND operation) to an inverted signal of the signal (potential) of the common line COM and the control signal COMHn and outputs an operation result (arithmetic result) to the common line COM. The operation result of the NAND gate 55 is inverted by the inverter 56 and the inverted operation result is input again to the NAND gate 55. In this manner, the COM latch circuit 50A holds predetermined data. Further, the inverted signal of the operation result of the NAND gate 55 is output to the signal line NCOM through the inverter 56 and the potential corresponding to the inverted signal is applied to the signal line NCOM.

In the detecting unit FU in FIG. 22, when the fuse data is at the "H" level and the control signal COMHn is at the "L" level, for example, the common line COM is at the "H" level and the signal line NCOM is at the "L" level.

As described above, as in the above-described embodiment, the COM latch circuit 50A including the NAND gate 55 is used as a data cache connected to the common line COM.

In the COM latch circuit 50A, the current driving force of the p-channel MOS transistor 131 of the MOS transistors 131 and 132 in the NAND gate 55 is smaller than the current driving force of the n-channel MOS transistors 41 and 42 of a check circuit of the sense unit SU. According to this, in a case in which verification fail is detected, the potential (signal level) of the common line COM is forcedly inverted from the "H" level to the "L" level.

Further, in this configuration example, the operation to invert the potential of the common line COM from the "L" level to the "H" level is executed by a logical operation by the NAND gate 55.

(b) Operation

The operation of the semiconductor memory (for example, flash memory) of the fourth embodiment is described with reference to FIG. 23. Herein, the operation of the flash memory of this embodiment is described appropriately with reference to FIGS. 21 and 22. Meanwhile, the operation common to that of the first to third embodiments is described as needed.

A fail bit detecting operation of the flash memory of this embodiment is described with reference to FIG. 23.

Figure 23:
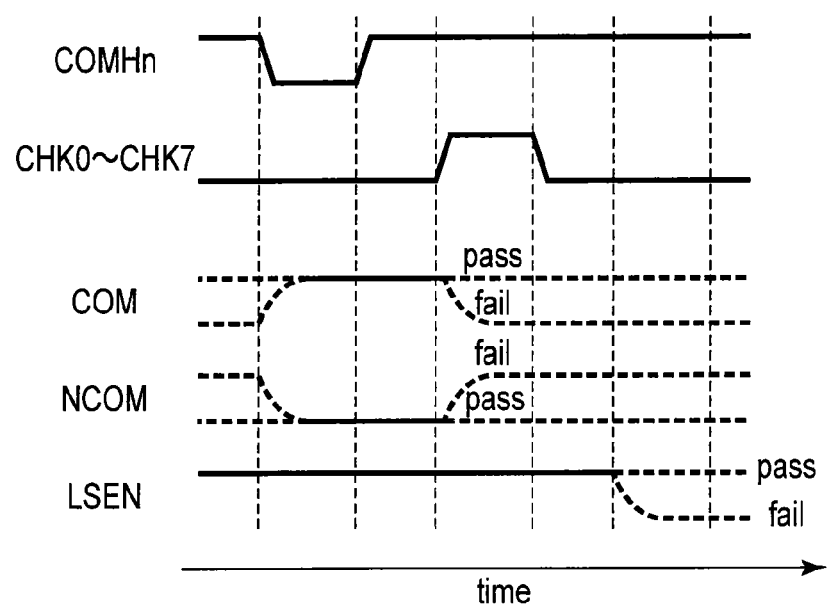
FIG. 23 is a timing chart of an operation example of the semiconductor memory of the fourth embodiment.

As described in FIG. 23, the control signal SEG is set at the "H" level, the MOS transistor 151 is turned on, and the control signal COMHn transitions from the "H" level to the "L" level.

The p-channel MOS transistor Tr2A is turned on by the control signal COMHn at the "L" level and the power-supply voltage Vdd is supplied to the common line COM.

Further, the control signal COMHn at the "L" level is input to the gate of the n-channel MOS transistor 130 and the gate of the p-channel MOS transistor 134 in the NAND gate 55, and the MOS transistor 130 is turned off and the MOS transistor 134 is turned on.

Then, the fuse data of the isolation latch circuit 70 is output to the gate of the MOS transistor 152. When the signal level of the fuse data is at the "H" level, the MOS transistor 152 is turned on. The fuse data at the "H" level indicates that the column block COL is the operation target.

In this manner, when the fuse data is at the "H" level, the common line COM and the signal line COMi are put into a charged state ("H" level) and the signal line NCOM is put into a discharged state ("L" level). The signal at the "L" level is input to each input terminal of the NAND gate 55, so that NAND gate 55 outputs the signal at the "H" level.

The control signal COMHn is set from the "L" level to the "H" level. At that time, since the signal at the "H" level and the signal at the "L" level are input to the NAND gate 55, the charged state at the "H" level of the common line COM is maintained by the output of the NAND gate.

Meanwhile, the fuse data at the "L" level indicates that the column block COL is failed. In this case, the column block COL is isolated from the operation target and the MOS transistor 152 is turned off. The common line COM and the signal line COMi are electrically separated from each other.

After the control signal COMHn is set at the "H" level, when the fuse data is at the "H" level, check signals CHK0 to CHK7 are set from the "L" level to the "H" level and n-channel MOS transistors $41_0$ to $41_7$ in sense units SU0 to SU7, respectively, are turned on.

Then, if even one verification fail ("H" level) is present in the verification results held by the sense amplifiers $40_0$ to $40_7$, the MOS transistor 42 to a gate of which a verification fail signal is input is turned on.

As described above, the current driving force of the p-channel MOS transistor 131 of the MOS transistors 131 and 132 is smaller than the current driving force of the n-channel MOS transistors 41 and 42 in the sense unit SU. Therefore, the potential of the common line COM is discharged and the potential of the common line COM transitions from the "H" level to the "L" level.

In association with this, the potential at the "L" level of the common line COM is inverted by the inverter 56 to be output to the signal line NCOM, so that the potential of the signal line NCOM reaches the "H" level.

At that time, two inputs to the NAND gate 55 are the control signal COMHn at the "H" level and the potential of the signal line NCOM at the "H" level. Therefore, an output of the NAND gate 55 is at the "L" level and the output is supplied to the common line COM.

In this manner, when the verification fails in the column block COL, the potential of the common line COM is at the "L" level and the potential of the signal line NCOM is at the "H" level.

On the other hand, when the column block COL does not include the verification fail, all the MOS transistors 42 in the column block COL are in the off-state. Therefore, the potential of the common line COM is maintained at the "H" level. The potential at the "H" level is inverted by the inverter 56 and the potential at the "L" level is applied to the signal line NCOM. The control signal COMHn at the "H" level and the potential of the signal line NCOM at the "L" level are input to the NAND gate 55, so that the output of the NAND gate 55 is at the "H" level.

In this manner, when the verification passes in the column block COL, the potential of the common line COM is at the "H" level and the potential of the signal line NCOM is at the "L" level.

Herein, as in the above-described embodiments, when the potential of the signal line NCOM is at the "H" level, an n-channel MOS transistor Tr1 the gate of which is connected to the signal line NCOM is turned on. According to this, a detecting line LSEN is discharged and the potential of the detecting line LSEN reaches the "L" level from the "H" level. According to this, the verification fail included in the column block COL is detected and it is judged that data writing is not completed.

On the other hand, when the potential of the signal line NCOM is at the "L" level, the MOS transistor Tr1 is not turned on. Therefore, the potential of the detecting line LSEN is maintained at the "H" level. According to this, it is judged that the data writing is completed.

Meanwhile, when the fuse data is at the "L" level, the MOS transistor 152 is in the off-state. Therefore, even when the signal level of the common line COM is at the "L" level, the signal at the "L" level is never supplied to the signal line COMi. Therefore, a current never flows from the signal line NCOM at the "H" level to the common line COM at the "L" level.

As described above, it is judged whether the write operation and erase operation are completed based on the verification result held by a plurality of sense units SU of the column block COL.

Meanwhile, in the flash memory of this embodiment, a self test for the COM latch circuit 50A and the isolation latch circuit 70 may also be executed by reading the data of data cache DT_cache substantially as in the example described in the second embodiment by the configuration illustrated in FIGS. 21 and 22. However, in this embodiment, when the potential of the common line COM is set at the "L" level at the time of the self test, by turning on the MOS transistors 41 and 42 of the sense unit SU, the common line COM is put into the discharged state ("L" level). Meanwhile, the data of the isolation latch circuit 70 is rewritten by the discharge of the node by control signal CSL, FCEN, and FCRST as in the above-described example.

Further, in the flash memory of this embodiment, as in the third embodiment, by further providing a transistor 193, which forms a current mirror circuit, and a fail bit count circuit (not illustrated), it is possible to count the number of fail bits included in each column block COL.

(c) Summary

In the semiconductor memory (for example, flash memory) of the fourth embodiment, as described with reference to FIGS. 21 to 23, the latch circuit 50A the configuration of which is different from that of the latch circuit 50 used in the first embodiment is connected to the common line COM. In this embodiment, the COM latch circuit 50A includes the NAND gate 55 and the inverter 56, for example.

The current driving force of the p-channel MOS transistor 131 of the inverter-connected MOS transistors 131 and 132 in the NAND gate 55 is smaller than the current driving force of the n-channel MOS transistors 41 and 42 in the sense unit SU. According to this, as in the above-described embodiments, the potential of the common line COM is forcedly inverted from the "H" level to the "L" level (discharged).

Further, in this embodiment, the common line COM transitions from the "L" level to the "H" level by the logical operation of the NAND gate 55 (charged). Therefore, a switching current resulting from the change in the signal level of the latch circuit 50A and the common line COM may be reduced. According to this, noise and power consumption may be reduced in the flash memory of this embodiment.

Further, according to this embodiment, the number of devices of the detecting unit FU and the fail bit detecting circuit 5 including a plurality of detecting units FU may be reduced. According to this, a manufacturing cost of the flash memory may be reduced.

As described above, the flash memory of this embodiment may inhibit the rate of failure of the flash memory, reduce the power consumption, or improve the margin in a circuit design as in the above-described embodiments.

Therefore, in this embodiment, it is possible to obtain an effect similar to that of the first to third embodiments and the reliability of the memory may be improved.

[Others]

Although the NAND flash memory is illustrated as the semiconductor memory in this embodiment, this embodiment may be applied to another flash memory such as a NOR type, a DRAM, or an SRAM. Further, this embodiment may be applied to a resistance change type memory such as an MRAM, a ReRAM, or a PCRAM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
   a memory cell array including a plurality of memory cells arranged along a row and a column;
   a sense amplifier circuit holding a verification result for each of the memory cells and including a plurality of sense units, the sense units of each column block being connected in common to a first signal line; and
   a detecting circuit including a detecting unit, the detecting unit including a first latch circuit which holds failure information in the memory cell array, and a second latch circuit which includes a first input terminal connected to the first signal line, a second input terminal connected to the first latch circuit, and a first output terminal connected to a second signal line.

2. The semiconductor memory according to claim 1, wherein the second latch circuit outputs an arithmetic result of a signal output to the first signal line and the failure information to the second signal line.

3. The semiconductor memory according to claim 1, wherein the second latch circuit includes a NOR gate, and a first inverter which includes a first transistor and a second transistor and a first input node connected to the first output terminal and includes a first output node connected to the first input terminal.

4. The semiconductor memory according to claim 3, wherein the sense unit includes a sense amplifier which holds the verification result and data, and an third transistor which includes a first current path connected to the first signal line, and
   wherein a current driving force of the third transistor is larger than the current driving force of the first transistor.

5. The semiconductor memory according to claim 3, wherein the detecting unit includes a self test unit connected to the first and second latch circuits, the self test unit judges whether the first and second latch circuits include a failure.

6. The semiconductor memory according to claim 5, wherein the self test unit includes a fourth transistor which includes a gate to which the failure information is input and a current path connected between the first and second transistors, a fifth transistor which includes a gate to which a first control signal is input and a current path of which one end is connected to the first signal line, a sixth transistor which includes a gate to which a second control signal is input and a current path of which one end is connected to the second signal line, a seventh transistor which includes a gate connected to the second signal line and a current path of which one end is connected to a cache, and an eighth transistor which includes a gate to which a third control signal is input and a current path connected to the other end of the current path of the seventh transistor.

7. The semiconductor memory according to claim 1, wherein the detecting circuit includes a ninth transistor having a gate connected to the second signal line; and a third signal line connected to one end of a current path of the ninth transistor, a potential of the third signal line changes by switching the ninth transistor.

8. The semiconductor memory according to claim 7, wherein verification results of the plurality of sense units included in the column block are collectively reflected in a signal of the first signal line, and the detecting circuit detects whether the column block includes verification fail based on a variation of the potential of the third signal line corresponding to an arithmetic result of the signal of the first signal line and the failure information by the second latch circuit output to the second signal line.

9. The semiconductor memory according to claim 1, further comprising:
   a tenth transistor having a gate connected to the second signal line;
   a third signal line connected to one end of a current path of the tenth transistor, a potential of the third signal line changed by switching the tenth transistor; and
   a count circuit connected to the third signal line and counting the number of verification fails included in the column block.

10. The semiconductor memory according to claim 9, wherein verification results of the plurality of sense units included in the column block are reflected in a signal of the first signal line one by one, and the count circuit counts the number of verification fails included in the column block based on a variation of the potential of the third signal line corresponding to an arithmetic result of the signal of the first signal line and the failure information by the second latch circuit output to the second signal line.

11. The semiconductor memory according to claim 1, wherein each of the memory cells is a transistor which includes a charge storage layer and a control gate electrode.

12. A semiconductor memory comprising:
   a memory cell array including a plurality of memory cells arranged along a row and a column;

a sense amplifier circuit holding a verification result for each of the memory cells and including a plurality of sense units, the sense units of each column block being connected in common to a first signal line; and a detecting circuit including a detecting unit, the detecting unit including a first latch circuit which holds failure information in the memory cell array, and a second latch circuit which includes a first input terminal connected to the first signal line, a second input terminal to which a first control signal is input, and a first output terminal connected to a second signal line.

13. The semiconductor memory according to claim 12, wherein input and output of a signal between the first signal line and the first input terminal of the second latch circuit is controlled based on the failure information, the second latch circuit outputs an arithmetic result of the first control signal and an inverted signal of the signal output to the first signal line to the second signal line.

14. The semiconductor memory according to claim 12, wherein the second latch circuit includes a first inverter which includes a first input node connected to the first signal line and a first output node connected to the second signal, and a NAND gate which includes a second output node connected to the first signal line, the second input node to which the first control signal is input, and a third input node connected to the second output node through the first inverter, and wherein the NAND gate includes inverter-connected a first transistor and a second transistor having a first connecting point as the third input node and a second connecting point as the second output terminal.

15. The semiconductor memory according to claim 14, wherein the sense unit includes a sense amplifier which holds the verification result and data, and a third transistor which includes a first gate and a first current path connected to the first signal line, and wherein a current driving force of the third transistor is larger than the current driving force of the first transistor.

16. The semiconductor memory according to claim 12, wherein the detecting unit includes a self test unit connected to the first and second latch circuit, the self test unit judges whether the first and second latch circuits include a failure.

17. The semiconductor memory according to claim 12, wherein detecting circuit includes a fourth transistor having a gate connected to the second signal line; and a third signal line connected to one end of a current path of the fourth transistor, a potential of the third signal line changes switching by the fourth transistor.

18. The semiconductor memory according to claim 17, wherein verification results of the plurality of sense units included in the column block are collectively reflected in a signal of the first signal line, and the detecting circuit detects whether the column block includes verification fail based on a variation of the potential of the third signal line corresponding to an arithmetic result of an inverted signal of the first signal line and the failure information by the second latch circuit output to the second signal line.

19. The semiconductor memory according to claim 12, further comprising:

a fifth transistor having a gate connected to the second signal line;

a third signal line connected to one end of a current path of the fifth transistor, a potential of the third signal line changed by switching the fifth transistor; and a count circuit connected to the third signal line and counting the number of verification fails included in the column block.

20. The semiconductor memory according to claim 19, wherein verification results of the plurality of sense units included in the column block are reflected in a signal level of the first signal line one by one, and the count circuit counts the number of verification fails included in the column block based on a variation of the potential of the third signal line corresponding to an arithmetic result of an inverted signal of the first signal line and the failure information by the second latch circuit output to the second signal line.

* * * * *